(12) United States Patent
Jung et al.

(10) Patent No.: US 11,049,926 B2
(45) Date of Patent: Jun. 29, 2021

(54) STRETCHABLE DISPLAY DEVICE

(71) Applicant: LG Display Co., Ltd., Seoul (KR)

(72) Inventors: Hyunju Jung, Seoul (KR); Eunah Kim, Seosan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 9 days.

(21) Appl. No.: 16/587,879

(22) Filed: Sep. 30, 2019

(65) Prior Publication Data

US 2020/0161403 A1 May 21, 2020

(30) Foreign Application Priority Data

Nov. 16, 2018 (KR) .................. 10-2018-0141992

(51) Int. Cl.
*H01L 27/32* (2006.01)
*H01L 51/00* (2006.01)

(52) U.S. Cl.
CPC ...... *H01L 27/3276* (2013.01); *H01L 27/3211* (2013.01); *H01L 51/0097* (2013.01)

(58) Field of Classification Search
None
See application file for complete search history.

(56) References Cited

U.S. PATENT DOCUMENTS

| 2014/0367655 | A1* | 12/2014 | Takii | H01L 51/56 257/40 |
| 2016/0028043 | A1* | 1/2016 | Kwon | H01L 51/5253 257/40 |
| 2017/0005077 | A1* | 1/2017 | Kim | G06F 1/1643 |
| 2018/0122882 | A1* | 5/2018 | Lee | H01L 27/3258 |

FOREIGN PATENT DOCUMENTS

KR 10-2015-0041509 A 4/2015

* cited by examiner

*Primary Examiner* — Jay C Chang
(74) *Attorney, Agent, or Firm* — Seed IP Law Group LLP

(57) ABSTRACT

A stretchable display device according to an embodiment of the present disclosure includes a stretchable first substrate. A plurality of second substrates is disposed on the first substrate and spaced apart from one another, and the second substrates have a greater rigidity than the first substrate. A transistor is disposed on each of the plurality of second substrates, and a planarization layer is disposed on the transistor. A light emitting element is disposed on the planarization layer, and the planarization layer may have a reverse-taper shape. Accordingly, since the planarization layer has a reverse-taper shape in the stretchable display device according to an embodiment of the present disclosure, it is possible to be in direct contact with lines at a lower portion without specific configuration.

15 Claims, 11 Drawing Sheets

STRETCHABLE DISPLAY DEVICE

CROSS-REFERENCE TO RELATED APPLICATIONS

This application claims the priority of Korean Patent Application No. 10-2018-0141992, filed Nov. 16, 2018, in the Korean Intellectual Property Office, the disclosure of which is incorporated herein by reference.

BACKGROUND

Technical Field

The present disclosure relates to a stretchable display device and, more particularly, to a stretchable display device that can reduce or minimize damage to an organic light emitting element when it is stretched.

Description of the Related Art

An Organic Light Emitting Display (OLED) that generates light by itself, a Liquid Crystal Display (LCD) that requires separate light sources, etc., are used as the display devices used in a computer monitor, a TV, and a mobile phone.

Display devices are being applied to more and more various fields including not only a computer monitor and a TV, but personal mobile devices, and a display device having a wide display area and reduced volume and weight is being studied.

Recently, a stretchable display device manufactured to be able to stretch/contract in a specific direction and change into various shapes by forming a display unit, lines, etc., on a flexible substrate such as plastic substrate that is a plastic material has been spotlighted as a next generation display device.

BRIEF SUMMARY

In various embodiments, the present disclosure provides a stretchable display device.

In some embodiments, the present disclosure provides a stretchable display device that can reduce or minimize damage to organic light emitting elements when it is stretched by improving the shape of a planarization layer, on which organic light emitting elements are disposed, to be separated for each subpixel.

In some embodiments, the present disclosure provides a stretchable display device in which subpixels can be independently driven by disposing auxiliary lines under a planarization layer, on which organic light emitting elements are disposed, to be in contact with cathodes.

In some embodiments, the present disclosure provides a stretchable display device in which a low-potential power voltage is supplied to a cathode without specific configuration by configuring to bring a low-potential line supplying a low-potential power voltage to an emitting element in direct contact with a cathode.

A stretchable display device according to an embodiment of the present disclosure includes: a stretchable first substrate; a plurality of second substrates on the first substrate, the second substrates spaced apart from one another and having a greater rigidity than the first substrate; a transistor on each of the plurality of second substrates; a planarization layer on the transistor; and a light emitting element on the planarization layer, in which the planarization layer may have a reverse-taper shape. Accordingly, since the planarization layer has a reverse-taper shape in the stretchable display device according to an embodiment of the present disclosure, it is possible to be in direct contact with lines at a lower portion without specific configuration.

A stretchable display device according to another embodiment of the present disclosure may include: a stretchable first substrate; a plurality of second substrates on the first substrate, the second substrates spaced apart from one another, each of the second substrates having a plurality of subpixels configured to emit light with different wavelengths; a first planarization layer on each of the plurality of second substrates; at least one auxiliary line on the first planarization layer; and a second planarization layer on the first planarization layer on which the at least one auxiliary line is disposed, the second planarization layer being divided into a plurality of separate portions, each of the separate portions of the second planarization layer corresponding to a respective one of the subpixels. Accordingly, since the organic light emitting element is formed on the second planarization layer disposed and divided for each subpixel in the stretchable display device according to another embodiment of the present disclosure, it is possible to reduce or minimize a crack of the organic light emitting element that may be generated when the stretchable display device is stretched.

The present disclosure provides various embodiments which have an effect that enables emitting elements and transistors of the stretchable display device to be easily bent or stretched without damage by spacing and disposing a plurality of second substrates having an island shape and made of a material, which is more rigid than a first substrate, apart from each other on the first substrate having a soft material and by forming a transistor and an organic light emitting element on the second substrates made of a rigid material.

According to various embodiments of the present disclosure, by disposing organic light emitting elements on planarization layers having a reverse-taper shape, the organic light emitting elements can be divided for each subpixel, so it is possible to reduce or minimize damage to the organic light emitting elements due to stretching of the stretchable display device.

According to various embodiments of the present disclosure, by disposing an auxiliary line under the planarization layer and bringing the auxiliary line and the cathode of an organic light emitting element in contact with each other, independent driving for each subpixel is possible.

According to various embodiments of the present disclosure, by forming an insulating layer of an area where a line supplying low-potential power is disposed to have a shape having a slope such that a portion of a low-potential power line is exposed, and by bringing the low-potential power line and a cathode in direct contact with each other, there is no need for specific configuration for bringing the cathode and the low-potential power line in contact with each other. Therefore, it is possible to reduce or minimize a large loss of area of the stretchable display device.

The effects according to the present disclosure are not limited to the contents described as examples above, and various other effects, features, or advantages of embodiments of the present disclosure are described in the present specification, while still others will be readily appreciated by those skilled in the art in view of the present disclosure.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
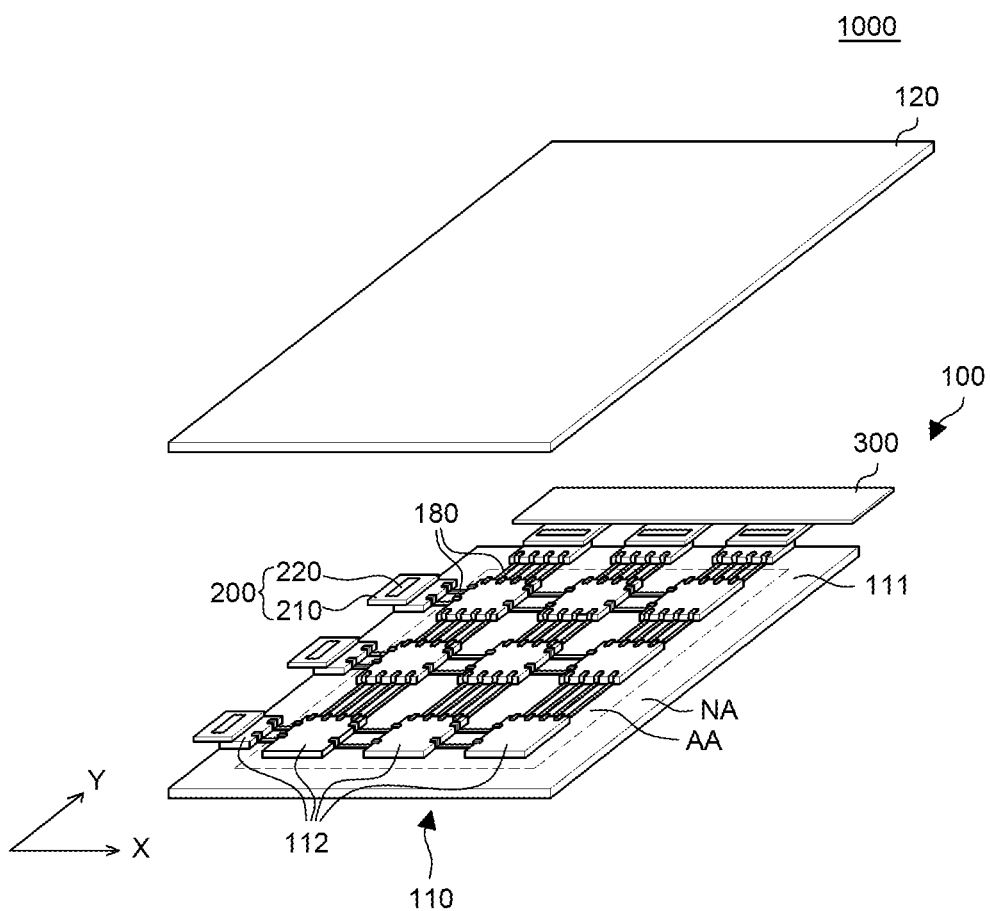
FIG. 1 is an exploded perspective view of a stretchable display device according to an embodiment of the present disclosure.

Advantages and characteristics of the present disclosure and methods of achieving the advantages and characteristics will be apparent by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including" and "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawings are illustrated for convenience of description, and the present disclosure is not limited to the size and the thickness of the components illustrated.

The features of various embodiments of the present disclosure can be partially or entirely combined with each other and can be interlocked and operated in technically various ways, and the embodiments can be carried out independently of or in association with each other.

Hereinafter, a stretchable display device according to exemplary embodiments of the present disclosure will be described in detail with reference to accompanying drawings.

A stretchable display device can be referred to as a display device that can display images even if it is bent or stretched. A stretchable display device can have high flexibility, as compared with conventional rigid display devices. Accordingly, the shape of the stretchable display device can be freely changed in accordance with operation by the user such as bending or stretching the stretchable display device. For example, when a user holds and pulls an end of a stretchable display device, the stretchable display device can be stretched by the force of the user. Alternatively, when a user puts a stretchable display device on an uneven wall, the stretchable display device can be disposed to be bent into the surface shape of the wall, for example, the stretchable display device may bend or flex so that it conforms to the uneven surface of the wall. Further, when the force applied by a user is removed, a stretchable display device can return into the initial shape.

FIG. 1 is an exploded perspective view of a stretchable display device according to an embodiment of the present disclosure. Referring to FIG. 1, a stretchable display device 1000 according to an embodiment of the present disclosure includes a display panel 100, a flexible connecting film 200, and a printed circuit board 300.

The display panel 100 can stretch and contract in any one direction of a first direction X and a second direction Y or can 2-dimensionally stretch and contract in the first direction X and the second direction Y. Here, the first direction X and the second direction Y define the plane of the stretchable display device 1000 and the second direction Y may be a direction perpendicular to the first direction X.

The display panel 100 includes a lower substrate 110 disposed at a lower portion and an upper substrate 120 disposed on the lower substrate 110. Though not shown in FIG. 1, the display panel 100 may further include a polarizing layer that may be disposed on the upper substrate 120 or under the lower substrate 110. Further, the lower substrate 110 and the upper substrate 120 of the display panel 100, though not shown, may be bonded by an adhesive layer. In various embodiments, the display panel 100 may generally be considered as including all of the features shown in FIG. 1 except for the flexible connecting film and the printed circuit board 300 which may be considered as separate features which in some embodiments may be attached to the display panel 100.

The lower substrate 110 is a substrate for supporting and protecting various components of the stretchable display device 1000. The lower substrate 110 may include a first substrate 111 made of a soft material to be able to bend and a second substrate 112 made of a rigid material so that the second substrate 112 is more rigid than the first substrate 111 (e.g., the second substrate 112 has a rigidity that is greater than that of the first substrate 111), and the second substrate 112 is disposed on the first substrate 111. As shown in FIG. 1, in some embodiments the lower substrate 100 may include a plurality of second substrates 112 which may be spaced apart from one another as shown in FIG. 1.

A stretchable display device should have an easily bending or stretching characteristic, so there have been attempts to use substrates that have a soft characteristic due to a low modulus (e.g., a low elastic modulus, which may be a Young's modulus). However, when a soft material such as polydimethylsiloxane (PDMS) having a low elastic modulus is used as the material of a lower substrate on which emitting elements are disposed, such a material having a low elastic modulus may be weakened by heating, so, due to this characteristic, the substrate may be damaged by relatively high temperature, for example, a temperature over 100° C. that is generated in the process of forming transistors and the light emitting elements.

Accordingly, light emitting elements should be formed on a substrate that is made of a material that can withstand high temperature, so damage to the substrate can be suppressed in the process of manufacturing the light emitting elements. Accordingly, there have been attempts to manufacture a substrate using materials that can withstand high temperature, which is generated in the manufacturing process, such as polyimide (PI). However, materials that can withstand high temperature do not have a soft characteristic due to their relatively high elastic moduli, so such substrates are not easily bent or stretched when stretchable display devices are stretched.

Therefore, the plurality of second substrates 112, each of which may be a relatively rigid substrate as compared with the less rigid first substrate 111, is disposed only in the areas where transistors or organic light emitting elements are disposed in the stretchable display device 1000 according to an embodiment of the present disclosure, so damage to the stretchable display device 1000 due to high temperature in the process of manufacturing the transistors or the organic light emitting elements may be minimized.

In the stretchable display device 1000 according to an embodiment of the present disclosure, the first substrate 111 that is a flexible substrate and the upper substrate 120 made of a soft material may be disposed respectively under and on the second substrates 112. Accordingly, the first substrate 111 and the upper substrate 120 excepting the areas overlapping the second substrates 112 that are a plurality of island substrates may be easily stretched or bent, so the stretchable display device 1000 may be achieved. Further, damage to the transistors, organic light emitting elements, etc., disposed on the second substrates 112 that are a plurality of island substrates made of a rigid material in comparison to the first substrate 111 and the upper substrate 120 may be suppressed although the stretchable display device 1000 is bent or stretched.

The first substrate 111 may be made of an insulating material that can bend or stretch. For example, the first substrate 111 may be made of silicon rubber such as polyidimethylsiloxane (PDMS) or an elastomer such as polyurethane (PU), so it may have flexibility. The material of the first substrate 111, however, is not limited thereto. The first substrate 111, which is a flexible substrate, may reversibly expand and contract. Further, an elastic modulus of the first substrate 111 may be several to hundreds of MPa and a tensile fracture rate may be 100% or more. The thickness of the first substrate may be 10 μm to 1 mm, inclusive, in some embodiments, but embodiments of the present disclosure are not limited thereto.

The plurality of second substrates 112 may be spaced apart from each other by gaps (which gaps may have one or more predetermined or fixed distances) and the plurality of second substrates 112 is disposed on the first substrate 111. Each of the plurality of second substrates 112 may have a size in which one pixel area including a plurality of subpixels may be defined, and for example, may have an island shape (e.g., each of the second substrates 112 may be an "island" that is spaced apart from the other second substrates 112). The plurality of second substrates 112 may be substrates that are more rigid than the first substrate 111, but the second substrates 112 may be flexible substrates having some flexibility, but with less elasticity than the first substrate 111. The plurality of second substrates 112, for example, may be made of polyimide (PI), polyacrylate, polyacetate, and the like.

The elastic modulus of the plurality of second substrates 112 may be higher than that of the first substrate 111. The elastic modulus is an elastic modulus indicating the ratio of deformation of a substrate caused by stress to stress applied to the substrate, and when the elastic modulus of a substrate is relatively high, the hardness may also be relatively high. Accordingly, the plurality of second substrates 112 may be a plurality of rigid substrates that is more rigid than the first substrate 111. The elastic modulus of the plurality of second substrates 112 may be a thousand times or more greater than that of the first substrate 111, but embodiments are not limited thereto. The plurality of second substrates 112 each may be electrically connected by connecting lines 180.

The connecting lines 180 may be electrically connected by connecting pads disposed on each of the plurality of second substrates 112 to each other. Here, the pads disposed on each of the plurality of second substrates 112 may be, for example, gate pads, data pads, and power pads. However, the connecting lines for supplying low-potential power of the connecting lines 180 may directly supply low potential to the light emitting elements which may be directly disposed on the second substrates 112 without a low-potential power pad. Accordingly, some of the connecting lines 180 may be electrically connected to corresponding second substrates 112 via one or more pads (e.g., electrically conductive pads), while other connecting lines 180 may be connected to corresponding second substrates 112 without such pads. The connecting lines 180 will be described below in more detail with reference to FIGS. 2, 3, and 8 to be described below.

The lower substrate 110 may have or define an active area AA and a non-active area NA surrounding the active area AA.

The active area AA is an area where images are displayed in the stretchable display device 1000. For example, the active area AA may correspond to a region in which pixels are disposed and emit light for displaying images. The plurality of second substrates 112 is disposed in the active area AA on the first substrate 111, and the second substrates 112 may be spaced apart from one another by gaps. A light emitting element and various driving elements for driving the light emitting element, for example, a switching film transistor, a driving film transistor, a capacitor, etc., are disposed on each of the plurality of second substrates 112. That is, a unit pixel including a plurality of subpixels may be disposed on each of the plurality of second substrates 112 in the active area AA. The plurality of subpixels each may be connected with various lines. For example, the plurality of subpixels each may be connected with various lines such as a gate line, a data line, a high-potential power line, a low-potential power line, and a reference voltage line.

The non-active area NA is an area adjacent to the active area AA. The non-active area NA may be disposed to surround the active area AA, adjacent to the active area AA. The non-active area NA is an area where an image is not displayed, and lines, circuit units, etc., may be disposed in the non-active area NA. For example, a gate driving circuit, a data driving circuit, and a plurality of signal pads and power pads may be disposed in the non-active area NA. Each of the pads may be connected with each of the plurality of subpixels disposed in the active area AA. In some embodiments, at least some of the plurality of second substrates 112 may be disposed in the non-active area NA on the first substrate 111, and may be spaced apart from one another by gaps. Accordingly, driving elements that can drive a plurality of subpixels, for example, transistors or IC chips constituting a gate driving circuit or a data driving circuit, etc., may be disposed on each of the plurality of second substrates 112 in the non-active area NA. The plurality of second substrates 112 disposed in the non-active area NA may also be electrically connected by extension of the connecting lines 180 in the active area AA.

The flexible connecting films 200, which may be films having various components on a base film 210 made of a material having flexibility, are components for supplying signals to the plurality of subpixels in the active area AA. The flexible connecting film 200 is disposed between the display panel 100 and the printed circuit board 300 and transmits signals input from the printed circuit board 300 to the pixels disposed on the lower substrate 110. That is, the flexible connecting film 200 may be disposed between the lower substrate 110 of the display panel 100 and the printed circuit board 300 and may electrically connect the lower substrate 110 and the printed circuit board 300. The flexible connecting film 200 may be bonded to a plurality of bonding pads disposed in the non-active area NA and supplies a power voltage, a data voltage, a gate voltage, etc., to each of the plurality of subpixels in the active area AA through the bonding pads. Various other components including the base film 210 and the driving IC 220 may be disposed on the flexible connecting films 200.

The base films 210 are layers supporting the driving ICs 220 of the flexible connecting films 200. The base films 210 may be made of an insulating material, for example, an insulating material having flexibility.

The driving ICs 220 are components that process data for displaying images and driving signals for processing the data. Although the driving ICs 220 are shown as being mounted in a Chip on Film (COF) type in FIG. 1, the driving ICs 220 are not limited thereto and may be mounted in the type of Chip On Glass (COG), Tape Carrier Package (TCP), etc.

Controllers such as an IC chip and a circuit unit may be mounted on the printed circuit board 300. Further, a memory, a processor, etc., also may be mounted on the printed circuit board 300. The printed circuit board 300 is a configuration that transmits signals for driving the transistor 150 from the controllers to the transistor 150.

The printed circuit board 300 is connected with the flexible connecting films 200, so they may be electrically connected with the plurality of subpixels disposed on the plurality of second substrates 112.

The upper substrate 120 is a substrate overlapping the lower substrate 110 to protect various components of the stretchable display device 1000. The upper substrate 120, which is a flexible substrate, may be made of a bendable or stretchable insulating material. For example, the upper substrate 120 may be made of a material having flexibility and may be made of the same material as the lower substrate 110, but embodiments are not limited thereto.

Though not shown in FIG. 1, the polarizing layer, which is a configuration suppressing external light reflection by the stretchable display device 1000, may be disposed on the upper substrate 120 while overlapping the upper substrate 120. However, the polarizing layer is not limited thereto and, may be disposed under the upper substrate 120, or may not be provided in some embodiments, depending on the configuration of the stretchable display device 1000.

FIGS. 2 to 8 are referred to hereafter to describe in more detail the stretchable display device 1000 according to one or more embodiments of the present disclosure.

Figure 2:
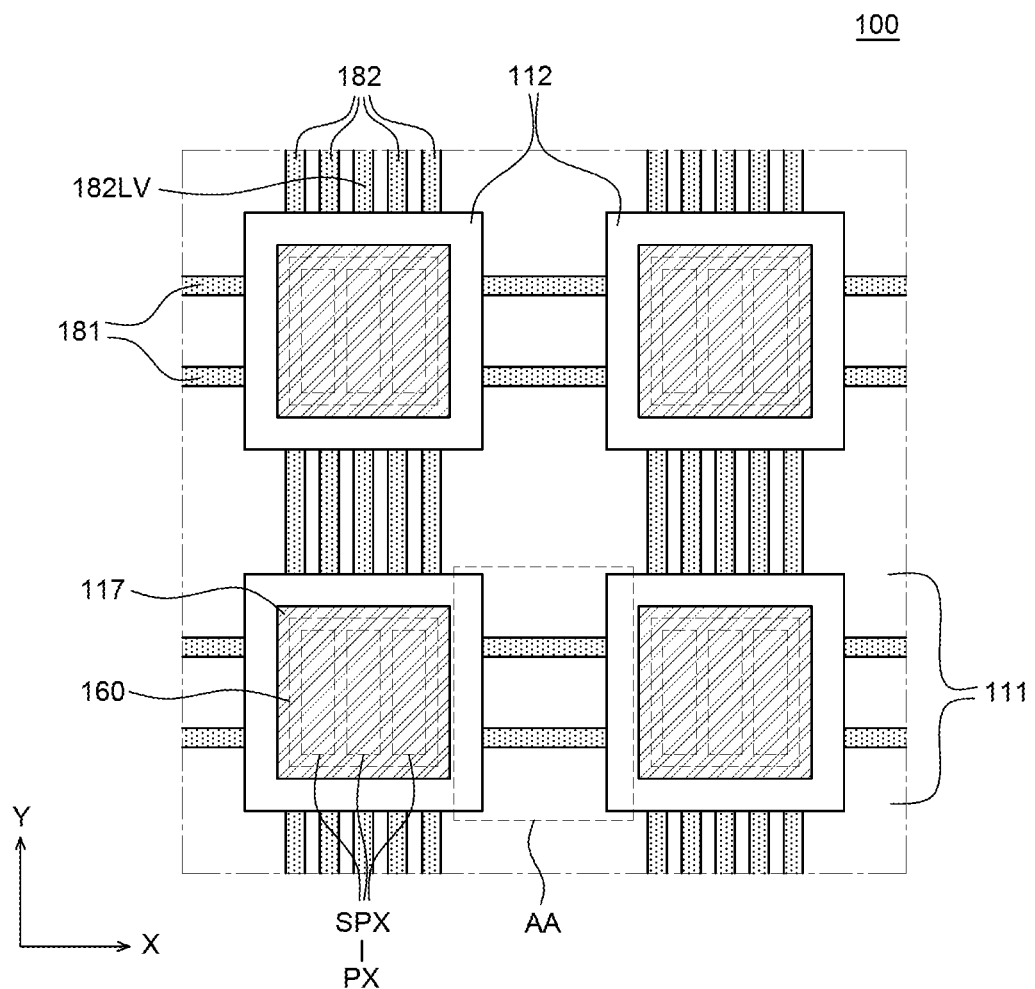
FIG. 2 is an enlarged plan view schematically showing a portion of an active area of a stretchable display device according to an embodiment of the present disclosure.
Figure 3:
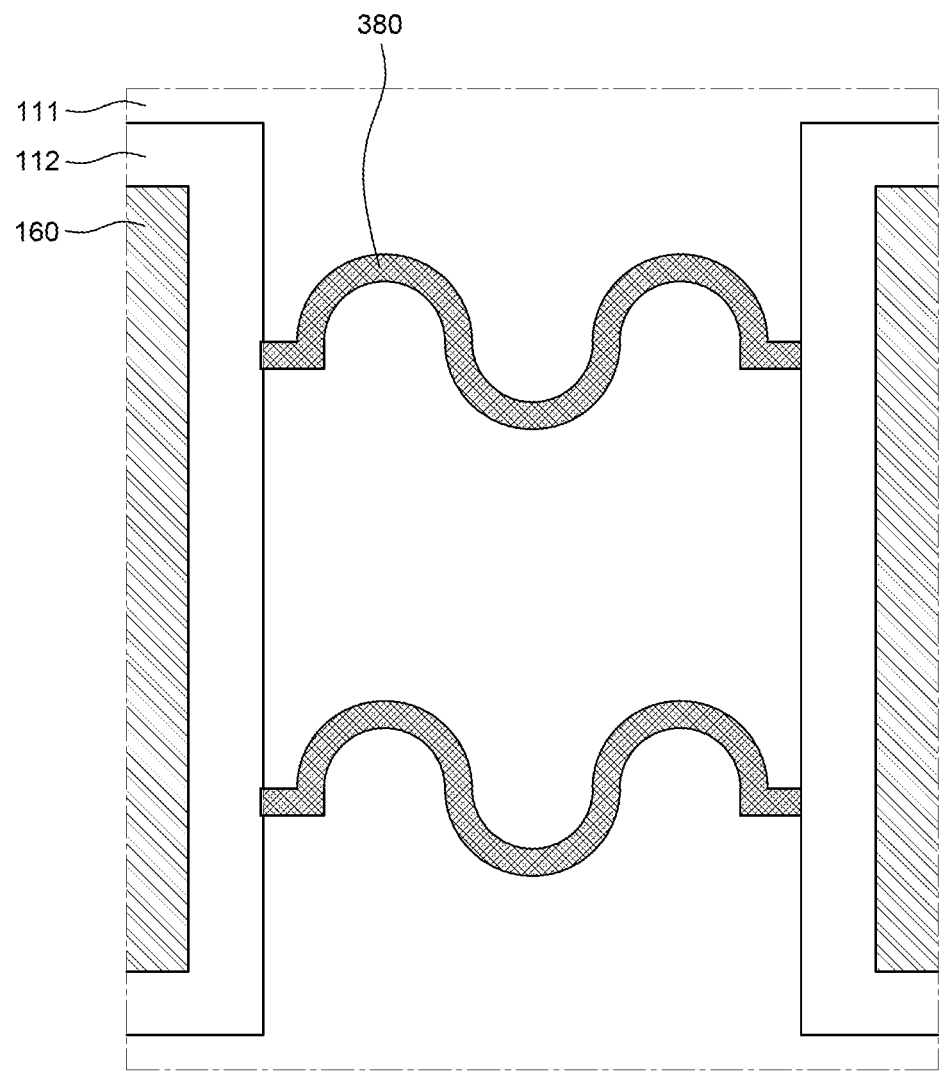
FIG. 3 is an enlarged plan view enlarging an area AA of FIG. 2 to illustrate another embodiment of connecting lines of a stretchable display device according to an embodiment of the present disclosure.
Figure 8:
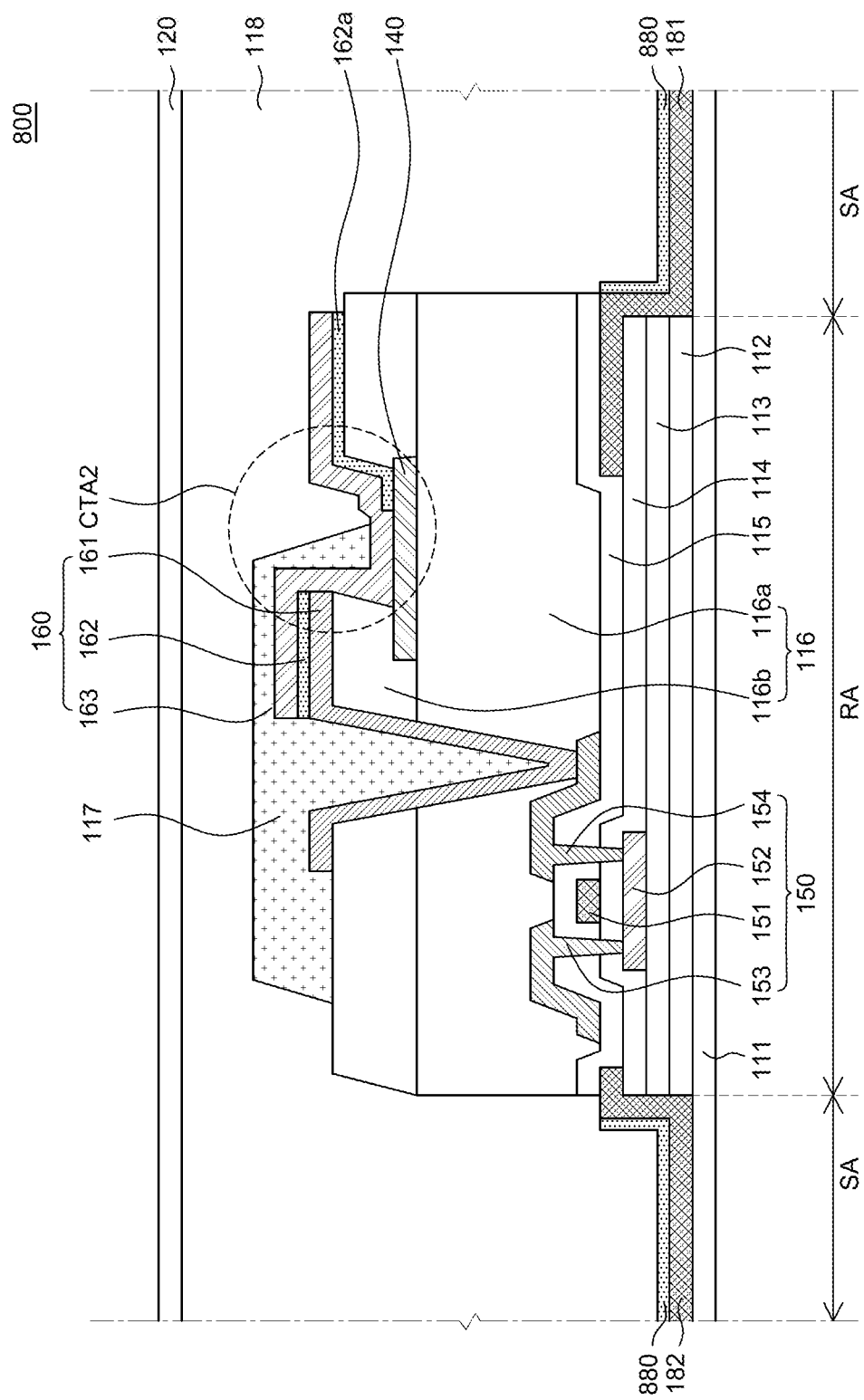
FIG. 8 is a cross-sectional view schematically showing a pixel of a stretchable display device according to another embodiment of the present disclosure.

FIG. 2 is an enlarged plan view schematically showing a portion of an active area of a stretchable display device according to an embodiment of the present disclosure. FIG. 3 is an enlarged plan view enlarging an area AA of FIG. 2 to illustrate another embodiment of connecting lines of a stretchable display device according to an embodiment of the present disclosure. FIG. 8 is a cross-sectional view schematically showing a pixel of a stretchable display device according to another embodiment of the present disclosure.

First, referring to FIG. 2, a first substrate 111, a plurality of second substrates 112 disposed on the first substrate 111, and connecting lines 180 electrically connecting the plurality of second substrates 112 are disposed on a lower substrate 110 of a stretchable display device 1000 according to an embodiment of the present disclosure.

The first substrate 111, which is a flexible lower substrate, may reversibly expand and contract and may have an elastic modulus of several to hundreds of MPa and a tensile fracture rate of 100% or more. Accordingly, the first substrate 111 may be made of a bendable or stretchable insulating material. The first substrate 111 may be made of silicon rubber such as polydimethylsiloxane (PDMS) or an elastomer such as polyurethane (PU), but embodiments are not limited thereto. A plurality of connecting lines 180 for electrically connecting the plurality of second substrates 112 disposed at an upper portion is disposed on the first substrate 111.

The plurality of second substrates 112 is spaced apart from each other and disposed on the first substrate 111. At this time, the plurality of second substrates 112 each may be spaced with the same gaps, for example, each of the plurality of second substrates 112 may be spaced apart from one or more adjacent second substrates by a same distance. As such, the plurality of second substrates 112 is each spaced a predetermined distance, so the plurality of second substrates 112 may be disposed in a matrix shape on the first substrate 111, as shown in FIGS. 1 and 2, but embodiments are not limited thereto.

The plurality of second substrates 112 may be made of a plastic material having flexibility and, for example, may be made of polyimide (PI), polyacrylate, polyacetate, etc. The plurality of second substrates 112 may have a large elastic modulus value in comparison to that of the first substrate 111. For example, the elastic modulus of the plurality of second substrates 112 may be a thousand times or more larger than that of the first substrate 111, but embodiments are not limited thereto.

A pixel PX including a light emitting element is disposed on each of the plurality of second substrates 112. The pixel PX, which in some embodiments may be a unit pixel, includes subpixels SPX emitting light having a specific wavelength band, for example, respectively emitting red, green, and blue light. Although three subpixels SPX emitting red, green, and blue light are described in an embodiment of the present disclosure, the present disclosure is not limited thereto. For example, the pixels PX may further include a subpixel emitting white light other than the subpixels SPX emitting red, green, and blue light. When a subpixel emitting white light is included, the stretchable display device 1000 according to an embodiment of the present disclosure may further include a color filter.

The subpixels SPX each may include a transistor and an organic light emitting element 160. The organic light emitting element 160 includes an anode, an organic light emitting layer, and a cathode. Further, the subpixels SPX each may further include a planarization layer disposed between the transistor and the organic light emitting element 160. That is, the organic light emitting element 160 is disposed on the planarization layer. At this time, the planarization layer may have a reverse-taper shape or a shape similar to the reverse-taper shape. As such, a detailed structure of the pixel PX and subpixel SPX will be described in detail below with reference to FIGS. 4 to 7B.

In some display devices, various lines such as a plurality of gate lines and a plurality of data lines are extended and disposed between a plurality of subpixels, and a plurality of subpixels is connected to one signal line. Accordingly, in such display devices, various lines such a gate line, a data line, a high-potential power line, and a reference voltage line extend from a side to the other side of the display devices on a substrate without disconnection.

In contrast, in the stretchable display device 1000 according to an embodiment of the present disclosure, various lines such as gate lines, data lines, high-potential power lines, and reference voltage lines, which are made of a metal material, are disposed on the plurality of second substrates 112. That is, in the stretchable display device 1000 according to an embodiment of the present disclosure, various lines made of a metal material may be disposed only on the plurality of second substrates 112 and may not be formed to be in contact with the first substrate 111. Accordingly, various lines disposed in the stretchable display device 1000 may be patterned to correspond to the plurality of second substrates 112 and discontinuously disposed. For example, each of the plurality of second substrates 112, which are spaced apart from one another, may have its own lines such as gate lines, data lines, high-potential power lines, reference voltage lines, and the like which extend only over the second substrates 112 and do not contact the first substrate 111.

In the stretchable display device 1000 according to an embodiment of the present disclosure, the low-potential power line supplying a low-potential power voltage to the emitting element may be disposed to be in direct contact with the display element on the second substrates 112, in more detail, the cathode. That is, the low-potential power line may be connected with an adjacent light emitting element without a pad for electric connection with the light emitting elements of the second substrates 112.

Meanwhile, in the stretchable display device 1000 according to an embodiment of the present disclosure, the pads on two adjacent second substrates 112 may be connected by the connecting lines 180 to connect the discontinuous lines (e.g., the various lines on the second substrates 112). That is, the connecting lines 180 electrically connect the pads on two adjacent second substrates 112. Accordingly, the stretchable display device 1000 according to an embodiment of the present disclosure includes a plurality of connecting lines 180 to electrically connect various lines such as gate lines, data lines, high-potential power lines, and reference voltage lines between the plurality of second substrates 112.

The connecting lines 180 electrically connect the plurality of second substrates 112. That is, the connecting lines 180 are disposed in spacing areas of the plurality of second substrates 112, e.g., in the gaps between neighboring second substrates 112. The connecting lines 180 may be disposed between the pads disposed on the plurality of second substrates 112 and may electrically connect each pad. Accordingly, the stretchable display device 1000 according to an embodiment of the present disclosure includes a plurality of connecting lines 180 to electrically connect various lines such as gate lines, data lines, high-potential power lines, low-potential power lines, and reference voltage lines between the plurality of second substrates 112. For example, though not shown, a gate line made of a metal material may be disposed on the plurality of second substrates 112 disposed adjacent to each other in the first direction X and gate pads may be disposed at both ends of the gate line. At this time, the plurality of gate pads on the plurality of second substrates 112 disposed adjacent to each other in the first direction X each may be connected to each other by a connecting line 180 functioning as a gate line. Accordingly, the gate lines disposed on the plurality of second substrates 112 and the connecting line 180 disposed on the first substrate 111 may function as one gate line. Further, all various lines that may be included in the stretchable display device 1000, such as the data lines, high-potential power lines, and reference voltage lines, also each may function as one line by a connection line 180, as described above.

Referring to FIG. 2, the connecting lines 180 may include first connecting lines 181 and second connecting lines 182.

The first connecting lines 181 mean lines disposed in the first direction X on the lower substrate 110. The first connecting lines 181 may connect pads on two second substrates 112 disposed in parallel of the pads on the plurality of second substrates 112 disposed adjacent to each other in the first direction X to each other. The first connecting line 181 can function as a gate line or a high-potential power line, but embodiments are not limited thereto.

The second connecting lines 182 are lines disposed in the second direction Y on the lower substrate 110. The second connecting line 182 can connect pads on two second substrates 112 disposed in parallel of the pads on the plurality of second substrates 112 disposed adjacent to each other in the second direction Y. The second connecting lines 182 can function as data lines, reference voltage lines, or low-potential power lines, but embodiments are not limited thereto. Second connecting lines 182LV that function as low-potential power lines of the plurality of second connecting lines 182 may be in direct contact with the light emitting element on the second substrates 112, in more detail, the cathode. This will be described in more detail below with reference to FIGS. 4 and 5.

In some embodiments, the connecting lines 180 include a base polymer and conductive particles. In detail, the first connecting line 181 and the second connecting line 182 may include a base polymer and conductive particles. The base polymers of the first connecting line 181 and the second connecting line 182 may be made of a bendable or stretchable insulating material similar to the first substrate 111. The base polymer, for example, may include silicon rubber such as polydimethylsiloxane (PDMS), an elastomer such as polyurethane (PU), styrene butadiene styrene (SBS), etc., but is not limited thereto. Accordingly, when the stretchable display device 1000 is bent or stretched, the base polymer may not be damaged, and in fact the base polymer and thus the first and second connecting lines 181, 182 may have flexibility so that they can be bent or stretched without breakage or damage in some embodiments. The base polymer may be formed by coating a material constituting the base polymer or applying the material using a slit to the top of the first substrate 111 and the bottom of the second substrates 112.

The conductive particles of the first connecting line 181 and the second connecting line 182 may be distributed in the base polymer. In detail, the first connecting line 181 and the second connecting line 182 may include conductive particles distributed with predetermined density in the base polymers. The first connecting line 181 and the second connecting line 182, for example, may be formed by uniformly stirring conductive particles in a base polymer and then coating or hardening the base polymer with the conductive particles distributed therein onto the top of the first substrate 111, the bottom of the second substrates 112, and the bottom of an adhesive layer, but embodiments are not limited thereto. The conductive particles may include at least one of silver (Ag), gold (Au), and carbon, but embodiments are not limited thereto.

The conductive particles distributed in the base polymers of the first connecting line 181 and the second connecting line 182 may form a conductive path electrically connecting gate pads disposed on adjacent two second substrates 112. Further, the conductive particles distributed in the base polymers of the first connecting line 181 and the second connecting line 182 may form a conductive path electrically connecting gate pads or data pads formed on second substrates 112 disposed at the outermost periphery of the plurality of second substrates 112 and pads disposed in the non-active area NA.

When the stretchable display device 1000 is bent or stretched, the first substrate 111 that is a flexible substrate may be deformed but the second substrates 112 that are rigid substrates having organic light emitting elements thereon may not be deformed. In this case, if the lines connecting each pad disposed on the plurality of second substrates 112 are not made of an easily bendable or stretchable material, the lines may be damaged, such as cracking, due to deformation of the lower substrate.

However, in the stretchable display device 1000 according to an embodiment of the present disclosure, it is possible to electrically connect the pads disposed on the plurality of second substrates 112, respectively, using the connecting lines 180 including a base polymer and conductive particles. The base polymer has flexibility to be able to easily deform. Accordingly, according to the stretchable display device 1000 of an embodiment of the present disclosure, even though the stretchable display device 1000 is deformed such as bending or stretching, the areas between the plurality of second substrates 112 may be easily deformed by the connecting lines 180 including the base polymer.

Further, according to the stretchable display device 1000 of an embodiment of the present disclosure, since the connecting lines 180 include conductive particles, the conductive paths composed of the conductive particles may not be damaged such as cracking even by deformation of the base polymer. For example, when the stretchable display device 1000 is deformed such as bending or stretching, the first substrate 111 that is a flexible substrate may be deformed in the other areas excepting the areas where the plurality of second substrates 112 that is rigid substrates is disposed. The distance between the plurality of conductive particles disposed on the deforming first substrate 111 may be changed. At this time, the density of the plurality of conductive particles disposed at the upper portion of the base polymers and forming the conductive paths may be maintained at a high level to be able to transmit electrical signals even though the distance between the plurality of conductive particles is increased. That is, even though distances between the conductive particles (e.g., at the upper or lower portions of the connecting lines 180) may be increased due to bending or stretching of the first substrate 111, the conductive particles may be dispersed within the base polymer with a suitable density to ensure that the connecting lines 180 suitably conduct and transmit electrical signals in the bent or stretched state. Accordingly, even if the base polymers are bent or stretched, the conductive paths formed by the plurality of conductive particles may smoothly transmit electrical signals. Further, even though the stretchable display device 1000 is deformed such as bending or stretching, electrical signals may be transmitted between each of the pads.

Referring to FIG. 2, the base polymers and the conductive particles distributed in the base polymers of the first connecting line 181 and the second connecting line 182 may connect in a straight line the pads disposed on adjacent second substrates 112. Accordingly, since the connecting lines 180 include a base polymer and conductive particles, the connecting lines 180 connecting the pads disposed on adjacent second substrates 112 may be disposed in a straight shape to have a minimum length. That is, the stretchable display device 1000 may be achieved even if the connecting lines 180 are not formed in a curved shape. To this end, base polymers may be formed in a straight shape connecting the plurality of second substrates 112 in the manufacturing process. Accordingly, the conductive paths formed by the conductive particles distributed in the base polymers also may be a straight shape. However, the shape and the process of forming the base polymers and the conductive particles of the first connecting line 181 and the second connecting line 182 are not limited thereto. Therefore, in the stretchable display device 1000 according to an embodiment of the present disclosure, it is possible to reduce or minimize the space occupied by the connecting lines 180.

In some embodiments, the base polymers of the connecting lines 180 may be disposed in the entire area of the first substrate 111. That is, the base polymers may be disposed in a single layer on the first substrate 111. Conductive particles may form a conductive path connecting the pads on a plurality of adjacent second substrates 112 on the base polymer. When the base polymers are disposed in a single layer in the entire area on the first substrate 111, there may be no separate process for patterning the base polymers. Accordingly, the process of manufacturing the base polymers and the connecting lines may be simplified, and the manufacturing costs and time may be reduced. Since the base polymers are disposed in a single layer in the entire area on the first substrate 111, the base polymers may more efficiently distribute the force that is applied when the stretchable display device 1000 is bent or stretched.

As such, in the stretchable display device 1000 according to an embodiment of the present disclosure, when the connecting lines 180 having a straight shape are made of a base polymer including conductive particles that can suppress a crack, it is possible to reduce or minimize the phenomenon that the connecting lines 180 are cracked and disconnected, even though the stretchable display device 1000 is stretched.

Meanwhile, although the case in which the connecting lines 180 are formed in a straight shape is described as an embodiment in FIG. 2, they are not limited thereto and connecting lines 380 may have a curved shape, as shown in FIG. 3.

Referring to FIG. 3, the connecting lines 380 electrically connect the pads disposed on adjacent second substrates 112 of the plurality of second substrates 112 and extend not in a straight shape, but in a curved shape between the pads. For example, as shown in FIG. 3, the connecting lines 380 may have a sine waveform shape having one or more S-shaped curves. However, the connecting lines 380 are not limited to this shape and may have various shapes in various embodiments. For example, the connecting lines 380 may have various shapes, for example, they may extend in a zigzag shape or a plurality of diamond-shaped connecting lines extends with the apexes connected (e.g., a plurality of lines which collectively form a plurality of diamond shapes having apexes at intersections between two or more of the lines).

The connecting lines 380, for example, may be made of a metal material such as copper (Cu), silver (Ag), gold (Au). Accordingly, since the connecting lines 380 have a curved shape, even though the connecting lines 380 are made of a metal material, the stretchable display device 1000 of the present disclosure may reduce or minimize damage to the connecting lines 380 when the display panel 100 is stretched. For example, the curved shape of the connecting lines 380 may allow for some stretching or bending which may cause the curved shape to deform (e.g., stretch) without breaking the connecting lines 380.

Meanwhile, as shown in FIG. 8, a conductive reinforcing member 880 may be disposed over the connecting line 180. A conductive reinforcing member 880 is a component that suppresses damage to or disconnection of the connecting lines 180 when the stretchable display device is repeatedly stretched, and in addition, that helps electrical signal transmission by being in contact with the connecting lines 180 even if the connecting lines 180 are cut. Although the conductive reinforcing member 880 is shown as being disposed over the connecting line 180 in FIG. 8, embodiments are not limited thereto. For example, the conductive reinforcing member 880 may be disposed under the connecting line 180 and may be disposed both over and under it. Further, when the conductive reinforcing member 880 is disposed, the connecting lines 180 may be made of a flexible metal material, for example, a material such as copper (Cu), silver (Ag), and gold (Au).

The conductive reinforcing member 880 may be a conductive polymer including a base polymer and conductive particles uniformly distributed in the base polymer. As a base polymer has an easily stretching property, the conductive reinforcing member 880 may have flexibility.

The base polymer is a base layer in which the conductive particles may be distributed, and may include styrene butadiene styrene (SBS), but is not limited thereto. Further, the conductive particles, which are particles having conductivity, may include at least one of silver (Ag), gold (Au), and carbon.

The conductive reinforcing member 880 may be disposed adjacent to sides of the plurality of second substrates 112. For example, as shown in FIG. 8, it may be disposed adjacent to a side of a second substrate 112 in contact with the top surface of the connecting line 180. When the conductive reinforcing member 880 is disposed under the connecting line 180, it may be in contact with the bottom surface of the connecting line 180, a side surface of the second substrate 112, and the top surface of the first substrate 111.

A step (e.g., a height difference) may exist between a portion of the connecting line 180 disposed on the plurality of second substrates 112 and a portion of the connecting line 180 disposed on the first substrate 111 due to the thickness of various components disposed on the second substrates 112. At this time, it is possible to reduce or minimize damage that may be applied to the connecting lines 180 by disposing a conductive reinforcing member 880 including a base polymer having flexibility under or over the connecting lines 180 to be in contact with or adjacent to sides of the plurality of second substrates 112.

Further, as shown in FIG. 8, when the conductive reinforcing member 880 is disposed over the connecting line 180, the conductive reinforcing member 880 may be formed on the connecting line 180 before the upper substrate 120 is bonded by an adhesive layer 118 after the connecting line 180 and all of various components on the plurality of second substrates 112 are formed. Accordingly, the conductive reinforcing member 880 can be more easily manufactured, and the manufacturing time or costs can be minimized.

Further, though not shown, when the conductive reinforcing member 880 is disposed between the connecting line 180 and the first substrate 111, that is, under the connecting line 180, the bonding force between the connecting line 180 and the first substrate 111 can be reinforced, and it can be suppressed that the connecting line 180 comes off the first substrate 111.

Meanwhile, the conductive reinforcing member 880 may include liquid metal. The liquid metal means metal existing in a liquid state at room temperature. For example, the liquid metal may include at least one of gallium, indium, natrium, lithium, and an alloy thereof, but embodiments are not limited thereto. When a crack is generated in the connecting lines 180, the liquid metal can fill the crack of the connecting lines 180. Accordingly, since the conductive reinforcing member 880 includes liquid metal, when the stretchable display device is deformed such as bending or stretching and a crack is generated in the connecting lines 180, the crack is filled with the liquid metal, so disconnection of the connecting lines 180 can be minimized. Further, the liquid metal has conductivity, so the entire resistance in the connecting lines 180 and the liquid metal can be reduced. Accordingly, electrical signals can be more smoothly transmitted between the pads on the plurality of second substrates 112.

Meanwhile, when the connecting line has a curved shape, as shown in FIG. 3, the conductive reinforcing member 880 may be disposed in a peak area of the connecting line 380. The peak area of the connecting lines 380 means an area where the amplitude of the curved connecting lines 380 is largest or larger than a predetermined threshold (e.g., at the peaks or valleys of the waveform shape). For example, when the connecting lines 380 have a sine waveform shape, the point where the amplitude of the connecting lines 380 is largest or larger than a predetermined threshold may be defined as a peak area. When the stretchable display device is deformed such as bending or stretching, stress can concentrate on the peak area of the connecting lines 380, as compared with other areas of the connecting lines 380. At this time, the conductive reinforcing member may be disposed at the inner edge of the peak area of the connecting lines 380. The inner edge of the peak area of the connecting lines 380 may mean an area where a radius of curvature is relatively small in the peak area and the outer edge of the peak area may mean an area where the radius of curvature is relatively large in the peak area of the connecting lines 380. At this time, the conductive reinforcing member 880 may be disposed under or over the connecting lines 380 at the inner edge of the peak area of the connecting lines 380.

When the stretchable display device 1000 is deformed such as bending or stretching, damage such as a crack or disconnection may be easily generated in the peak area of the connecting lines 380, particularly, at the inner edge of the peak area in comparison to other areas. At this time, even if damage is generated in the peak area of the connecting lines 380 or at the inner edge of the peak area, the conductive reinforcing member can suppress blocking of an electrical signal, so transmission of electrical signals in the stretchable display device can be stably performed.

The structure of the pixels PX in the stretchable display device 1000 according to an embodiment of the present disclosure is described in detail hereafter.

Figure 4:
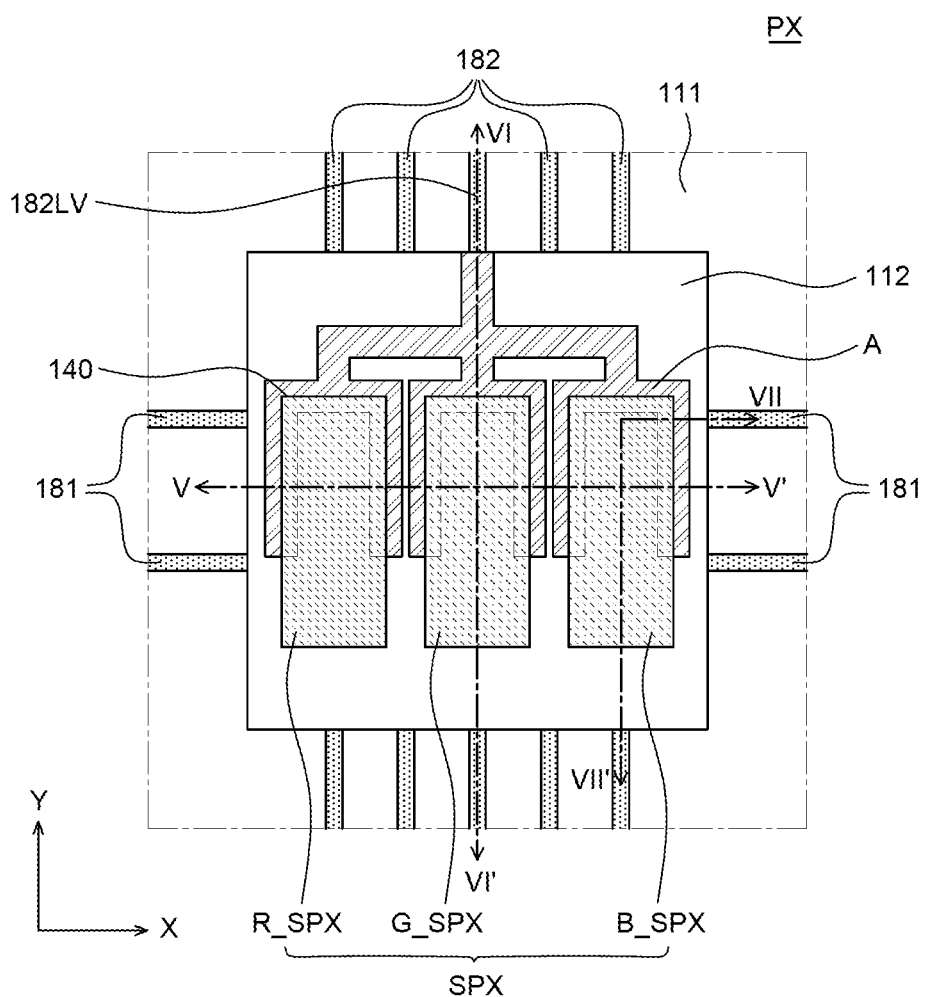
FIG. 4 is an enlarged plan view schematically showing a pixel of a stretchable display device according to an embodiment of the present disclosure.
Figure 5A:
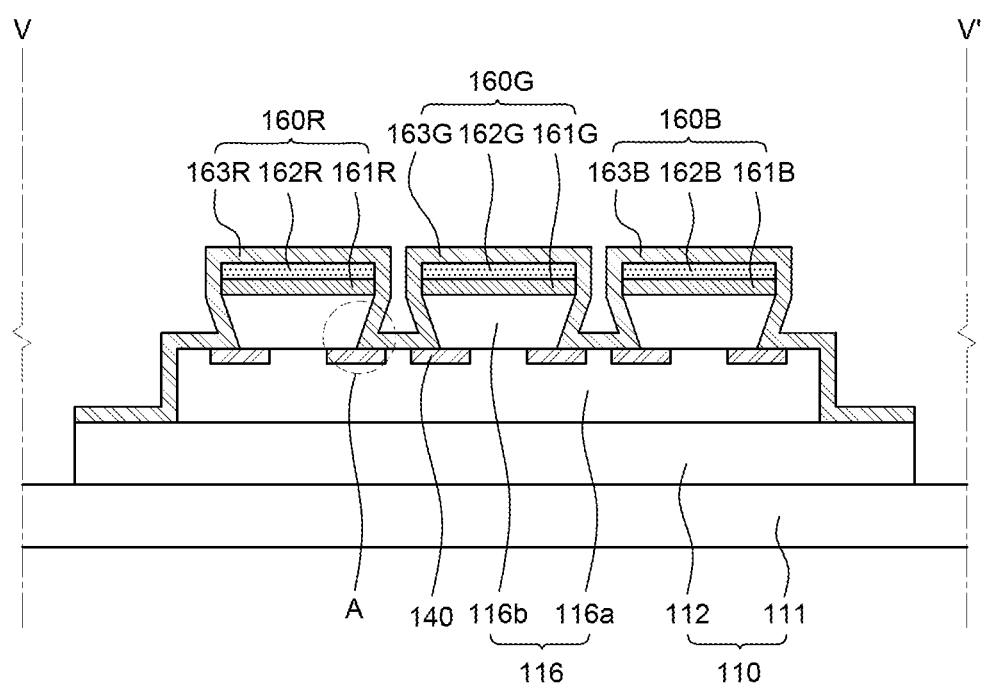
FIG. 5A and FIG. 5B are cross-sectional views taken along line V-V' of FIG. 4.
Figure 5B:
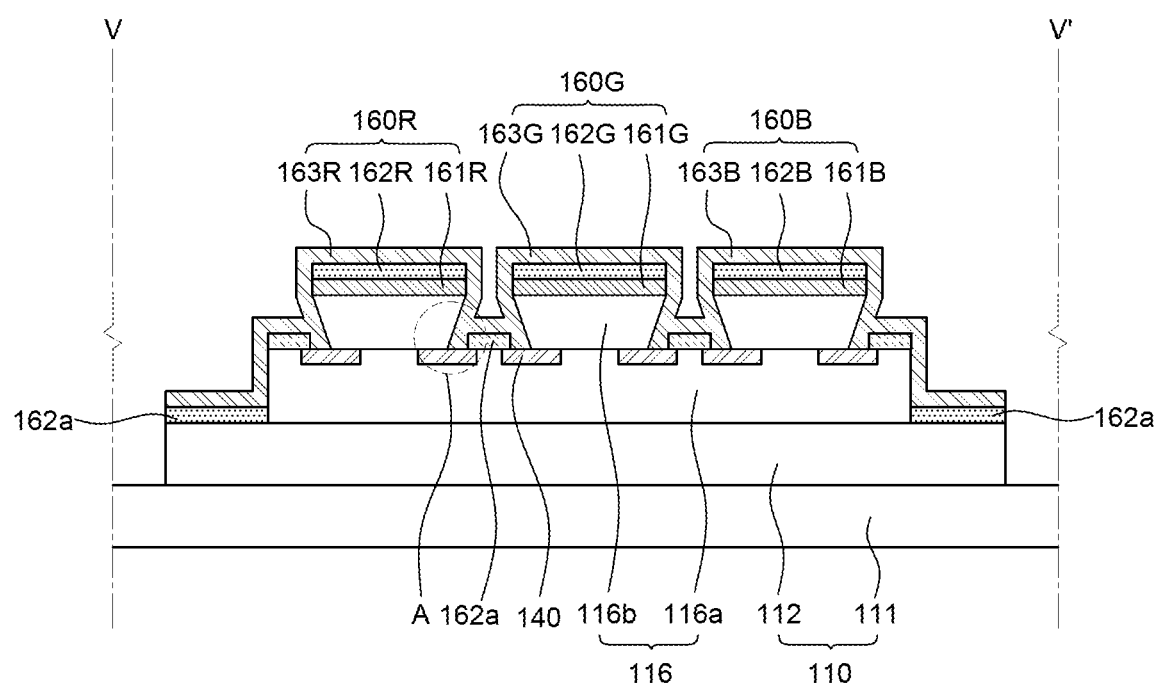

FIG. 4 is an enlarged plan view schematically showing a pixel of a stretchable display device according to an embodiment of the present disclosure. FIG. 5A and FIG. 5B are cross-sectional views taken along line V-V' of FIG. 4.

Meanwhile, before describing FIGS. 4 to 5B, FIGS. 5A and 5B are views for describing the configuration of a subpixel SPX disposed in the pixel PX in more detail and are views showing only a first planarization layer, a second planarization layer, and an organic light emitting element for the convenience of description. Accordingly, though not shown in FIGS. 5A and 5B, each subpixel SPX may further include a transistor and a capacitor.

Referring to FIGS. 4 to 5B, the pixel PX of the stretchable display device 1000 according to an embodiment of the present disclosure may include a subpixel SPX including a red subpixel R_SPX that emits red light, a green subpixel G_SPX that emits green light, and a blue subpixel B_SPX that emits blue light. However, although the subpixel SPX is shown as being composed of only subpixels that emit red, green, and blue light in FIGS. 4 to 5B, embodiments are not limited thereto. For example, the subpixels SPX of the stretchable display device 1000 according to an embodiment of the present disclosure may further include a subpixel that emits white or yellow light other than the subpixels that emit red, green, and blue light.

First, referring to FIG. 4, the red subpixel R_SPX that emits red light, the green subpixel G_SPX that emits green light, and the blue subpixel B_SPX that emits blue light each are spaced apart from one another and disposed in the first direction X. The pixel PX including the red subpixel R_SPX, the green subpixel G_SPX, and the blue subpixel B_SPX receives a driving signal and a power voltage of a pixel from a plurality of first connecting lines 181 and a plurality of second connecting lines 182.

The first connecting lines 181, which are connecting lines extending in the first direction X, can transmit a gate signal or a high-potential power voltage to each subpixel SPX.

The second connecting lines 182, which are connecting lines extending in the second direction Y, can transmit a data signal, a low-potential power voltage, or a reference voltage to each subpixel SPX. In describing the stretchable display device 1000 according to an embodiment of the present disclosure, the reference numeral of a low-potential power connecting line supplying a low-potential power voltage in a subpixel SPX will be given as 182LV for the convenience of description.

The low-potential power connecting line 182LV is a line transmitting a low-potential power voltage. The low-potential power connecting line 182LV is disposed in direct contact with the cathode 163 of the organic light emitting element 160 disposed on the second substrates 112. That is, the low-potential power connecting line 182LV is directly connected with the cathode 163 of the organic light emitting element 160. Accordingly, the stretchable display device 1000 according to an embodiment of the present disclosure does not need a specific pad for electrically connecting the low-potential power connecting line 182LV and the cathode 163 on the second substrates 112. Any one side of the planarization layer 116 disposed in the area where the low-potential power connecting line 182LV is disposed is formed to have a slope decreasing in width downward, so a portion of the low-potential power connecting line 182LV is exposed. Further, the cathode 163 is disposed along the shape of the planarization layer 116 having a slope shape. Accordingly, such electrical connection of the low-potential power connecting line 182LV and the cathode 163 can be made.

Accordingly, since the stretchable display device 1000 according to an embodiment of the present disclosure does not need a specific pad for electrical connection of the low-potential power connecting line 182LV and the organic light emitting element 160, that is, the cathode 163, it is possible to more efficiently use the area of the second substrates 112.

Referring to FIGS. 5A and 5B, a first planarization layer 116a is disposed on the second substrate 112 on which a transistor (not shown) is disposed. The first planarization layer 116a is disposed to planarize the surface of the top of the transistor. For example, the first planarization layer 116a may provide a substantially planar or flat surface over the transistor. The first planarization layer 116a may be made of an insulating material, and for example, is made of one or more materials of polyacrylates resin, epoxy resin, phenolic resin, polyamides resin, polyimides resin, unsaturated polyesters resin, poly-phenylene ethers resin, poly-phenylene-sulfides resin, and benzocyclobutene, but embodiments are not limited thereto. An auxiliary line 140 is disposed on the first planarization layer 116a. The first planarization layer 116a may include a contact hole that exposes the surface of the drain electrode of the transistor.

A plurality of auxiliary lines 140 may be disposed on the first planarization layer 116a. For example, one or more auxiliary lines 140 may be provided for each of the subpixels SPX. The auxiliary line 140, referring to FIGS. 4 to 5B, may be disposed at both ends of the subpixel SPX to be able to define each subpixel SPX. Meanwhile, although it was described that the auxiliary line 140 may be disposed at both ends of the subpixel SPX to be able to define each subpixel SPX, it is not limited thereto and may be disposed in an area in which it can be in contact with the cathode disposed in each subpixel SPX. A second planarization layer 116b disposed for each subpixel SPX to be described below is disposed to have a reverse-taper shape in correspondence to the end of each subpixel SPX, whereby a portion of the auxiliary line 140 disposed at the end of each subpixel SPX may be exposed. The reverse-taper shape of the second planarization layer 116b is a shape in which side surfaces of the second planarization layer 116b are tapered inwardly from a first surface of the second planarization layer 116b (e.g., an upper or top surface) to a second surface of the second planarization layer 116b (e.g., a lower or bottom surface). Accordingly, the auxiliary line 140 may be in direct contact and electrically connected with the cathode 163 disposed along the shape of the second planarization layer 116b. The auxiliary line 140 may be made of a transparent conductive material, for example, any one of indium tin oxide (ITO), indium zinc oxide (IZO), and indium tin zinc oxide (ITZO), but is not limited thereto and may be made of various metal materials. However, the auxiliary line 140 can be disposed to overlap the area where the organic light emitting element 160 is disposed, so it may be made of a metal material that may not influence reduction of a light emitting area.

The auxiliary line 140 can serve as the cathode 163. Further, the auxiliary line 140 can lower the resistance of the electrically connected cathode 163. The lowered resistance of the cathode 163 can attenuate a voltage drop phenomenon that is a phenomenon in which the potential difference between the anode 161 and the cathode 163 decreases. A predetermined voltage is applied to the auxiliary line 140 from the outside and the predetermined voltage may be a ground GND or low-potential power voltage. The second planarization layer 116*b* is disposed on the auxiliary line 140.

Referring to FIGS. 5A and 5B, the second planarization layer 116*b* is disposed by patterning for each subpixel SPX. That is, the second planarization layer 116*b* may define the light emitting area of the subpixel SPX. At this time, the second planarization layer 116*b* has a reverse-taper shape. Accordingly, the second planarization layer 116*b* can expose a portion of the auxiliary line 140 disposed at a lower portion. By the shape of the second planarization layer 116*b*, the stretchable display device 1000 according to an embodiment of the present disclosure can form a contact area A where the cathode 163 and the auxiliary line 140 are in contact. At this time, a plurality of auxiliary lines 140 is disposed, so a plurality of contact areas A may be formed.

Meanwhile, as described above, it may be defined as a cathode contact area A including the contact area (hereafter, defined as a 'first contact area') where the low-potential power connecting line 182LV and the cathode 163 are in direct contact and the contact area (hereafter, defined as a 'second contact area') where the auxiliary line 140 and the cathode 163 are in contact. The cathode contact area A, as shown in FIG. 4, may be formed only in some area in the second direction Y with respect to the center of the second substrate 112 when seen in a plane. Meanwhile, the cathode contact area A shown in FIGS. 5A and 5B is a second contact area where the auxiliary line 140 and the cathode 163 are in contact.

Referring to FIGS. 5A and 5B, the organic light emitting element 160 of each subpixel SPX is disposed on the second planarization layer 116*b* patterned in a reverse-taper shape for each subpixel SPX. At this time, the second planarization layer 116*b* having a reverse-taper shape may be spaced and disposed for each subpixel SPX. Accordingly, the organic light emitting element 160 can be divided for each subpixel SPX, so the stretchable display device 1000 according to an embodiment of the present disclosure can independently drive the organic light emitting element 160 for each subpixel SPX. Further, since the second planarization layer 116*b* is patterned for each subpixel SPX, it is possible to further minimize generation of a crack that may be generated in the organic light emitting element 160 that is a emitting element when the stretchable display device 1000 is stretched, as compared with the case when the second planarization layer 116*b* is not patterned and is disposed on the front surface of the second substrate 112.

The second planarization layer 116*b* may be made of an insulating material, equally to the first planarization layer 116*a*. For example, the second planarization layer 116*b* may be made of an inorganic insulating material or an organic insulating material. For example, it is made of one or more materials of polyacrylates resin, epoxy resin, phenolic resin, polyamides resin, polyimides resin, unsaturated polyesters resin, poly-phenylenethers resin, poly-phenylenesulfides resin, and benzocyclobutene, but is not limited thereto. Though not shown in FIGS. 4 to 5B, the contact hole formed in the first planarization layer 116*a* to expose the surface of the drain electrode of the transistor may be extended and disposed in the second planarization layer 116*b*.

A red organic light emitting element 160R in which an anode 161R, an organic light emitting layer 162R, and a cathode 163R for emitting red light are sequentially disposed is disposed on the second planarization layer 116*b* disposed in the red subpixel R_SPX, a green organic light emitting element 160G in which an anode 161G, an organic light emitting layer 162G, and a cathode 163G for emitting green light are sequentially disposed is disposed on the second planarization layer 116*b* disposed in the green subpixel G_SPX, and a blue organic light emitting element 160B in which an anode 161B, an organic light emitting layer 162B, and a cathode 163B for emitting green light are sequentially disposed is disposed on the second planarization layer 116*b* disposed in the blue subpixel B_SPX. That is, the area where the second planarization layer 116*b* having a reverse-taper shape may be the light emitting area of the stretchable display device 1000 according to an embodiment of the present disclosure. Accordingly, in the stretchable display device 1000 according to an embodiment of the present disclosure, by disposing the organic light emitting element 160 on the second planarization layer 116*b* having a reverse-taper shape, it is possible to widen the light emitting area in comparison to the case when an organic light emitting element is disposed in an area defined by a taper-shaped bank in the related art.

Meanwhile, although only the cathode 163 is shown as being disposed in the spacing area between the subpixels SPX in FIG. 5A, it is not limited thereto and an organic light emitting material 162*a* may be further disposed in the spacing area between the subpixels SPX, as shown in FIG. 5B, by a process of forming the organic light emitting layer 162, for example, a Fine Metal Mask (FMM). Since such an organic light emitting material 162*a* remains, it is possible to suppress an electrical interference phenomenon between the subpixels SPX due to electrical contact of the auxiliary line 140 with the cathode 163.

Further, as shown in FIGS. 5A and 5B, the cathode 163R disposed in the red subpixel R_SPX, the cathode 163G disposed in the green subpixel G_SPX, and the cathode 163B disposed in the blue subpixel B_SPX that are disposed in each subpixel SPX may be disposed to extend without disconnection on the second substrate 112. That is, the cathode 163R disposed in the red subpixel R_SPX, the cathode 163G disposed in the green subpixel G_SPX, and the cathode 163B disposed in the blue subpixel B_SPX that are disposed in each subpixel SPX may be disposed on the front surface of the second substrate 112, not divided for each subpixel SPX.

As such, in the stretchable display device 1000 according to an embodiment of the present disclosure, the second planarization layer 116*b* is formed to have a reverse-taper shape, so electrical connection of the auxiliary line 140 and the cathode 163 disposed at a lower portion may be more easily made.

Next, the cross-section of each subpixel disposed on the second substrate 112 of the stretchable display device 1000 according to an embodiment of the present disclosure will be described in more detail.

Figure 6A:
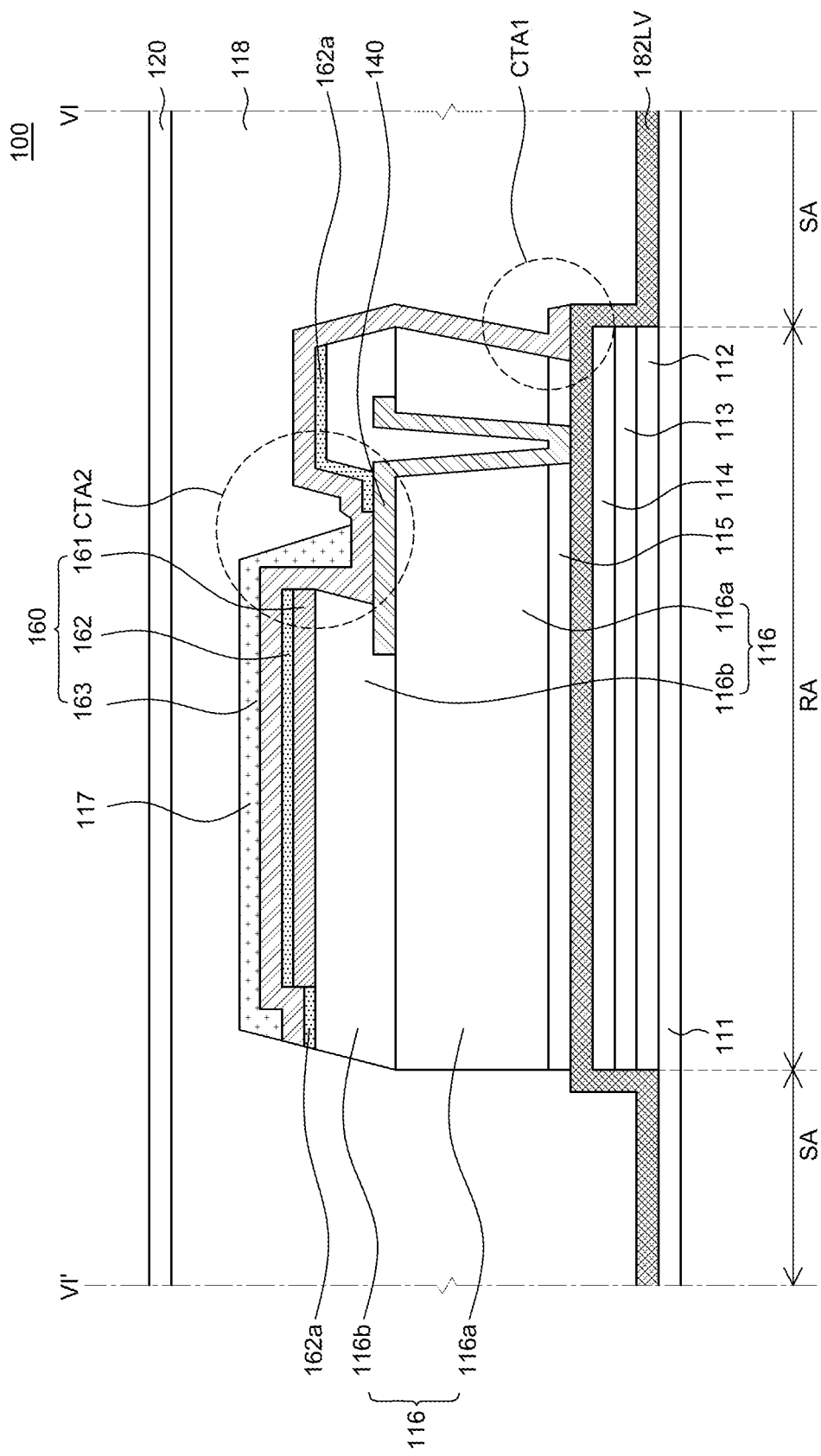
FIG. 6A is a cross-sectional view taken along line VI-VI' of FIG. 4.
Figure 6B:
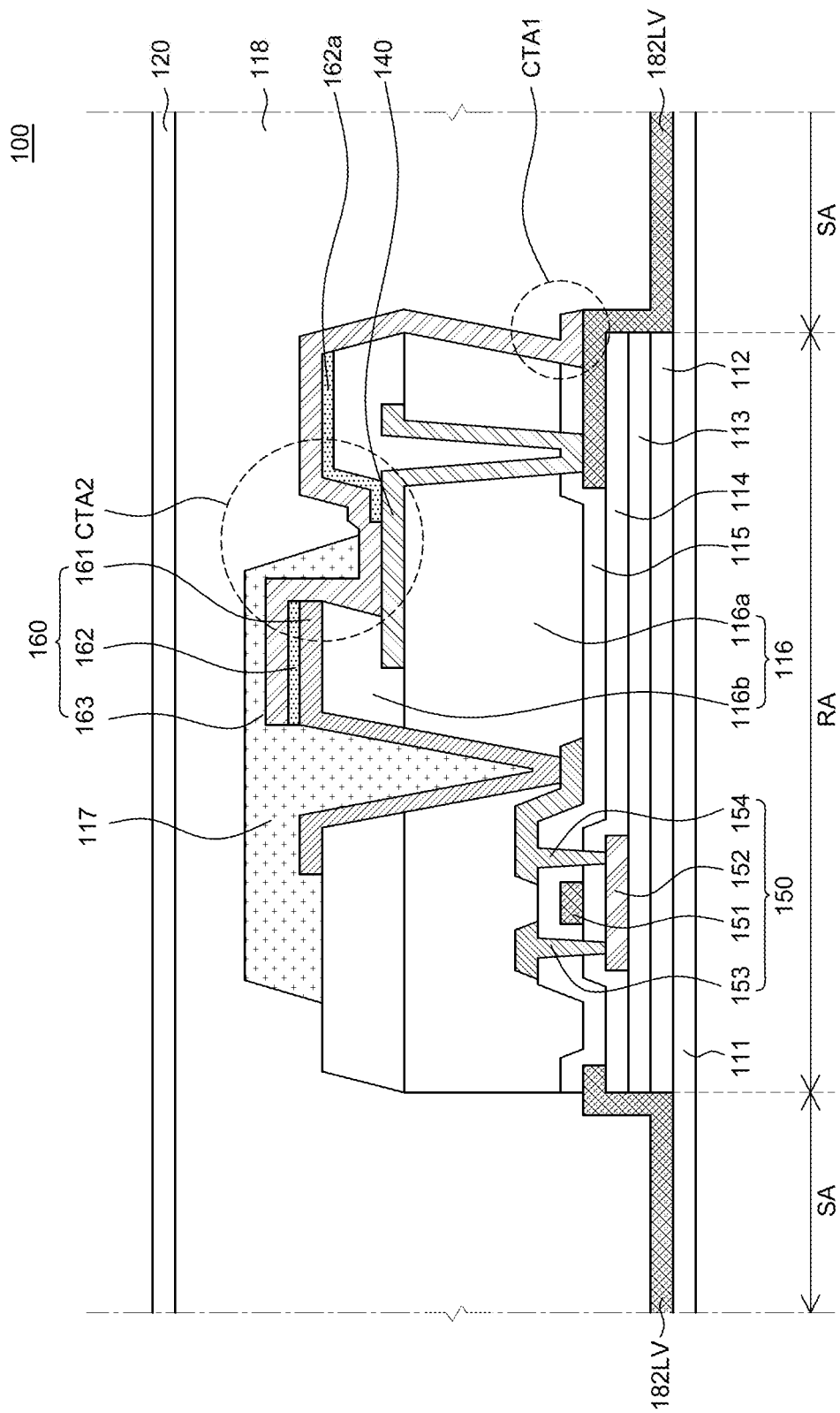
FIG. 6B is a cross-sectional view taken along line VI-VI' of FIG. 4.
Figure 7A:
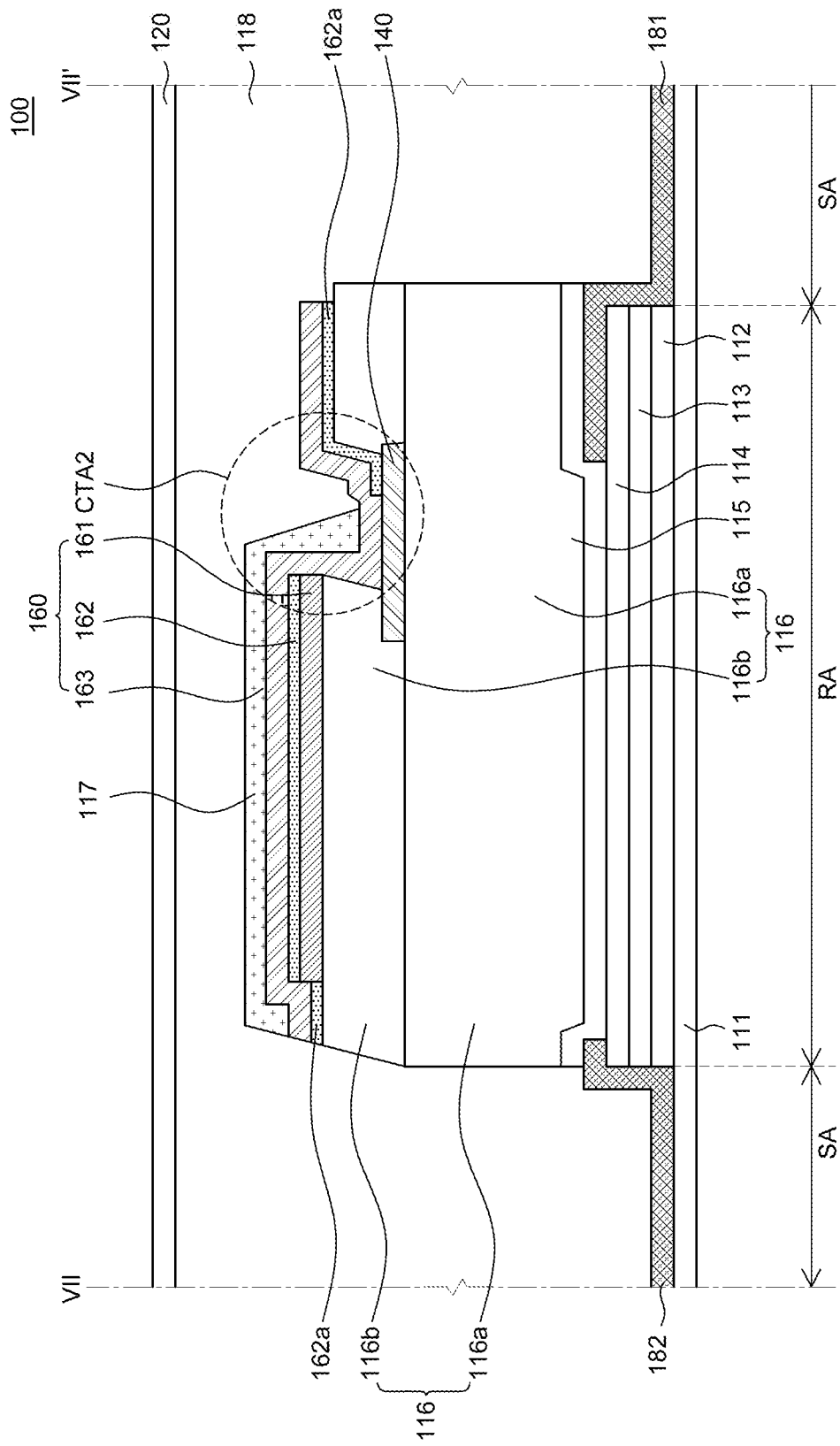
FIG. 7A is a cross-sectional view taken along line VII-VII' of FIG. 4.
Figure 7B:
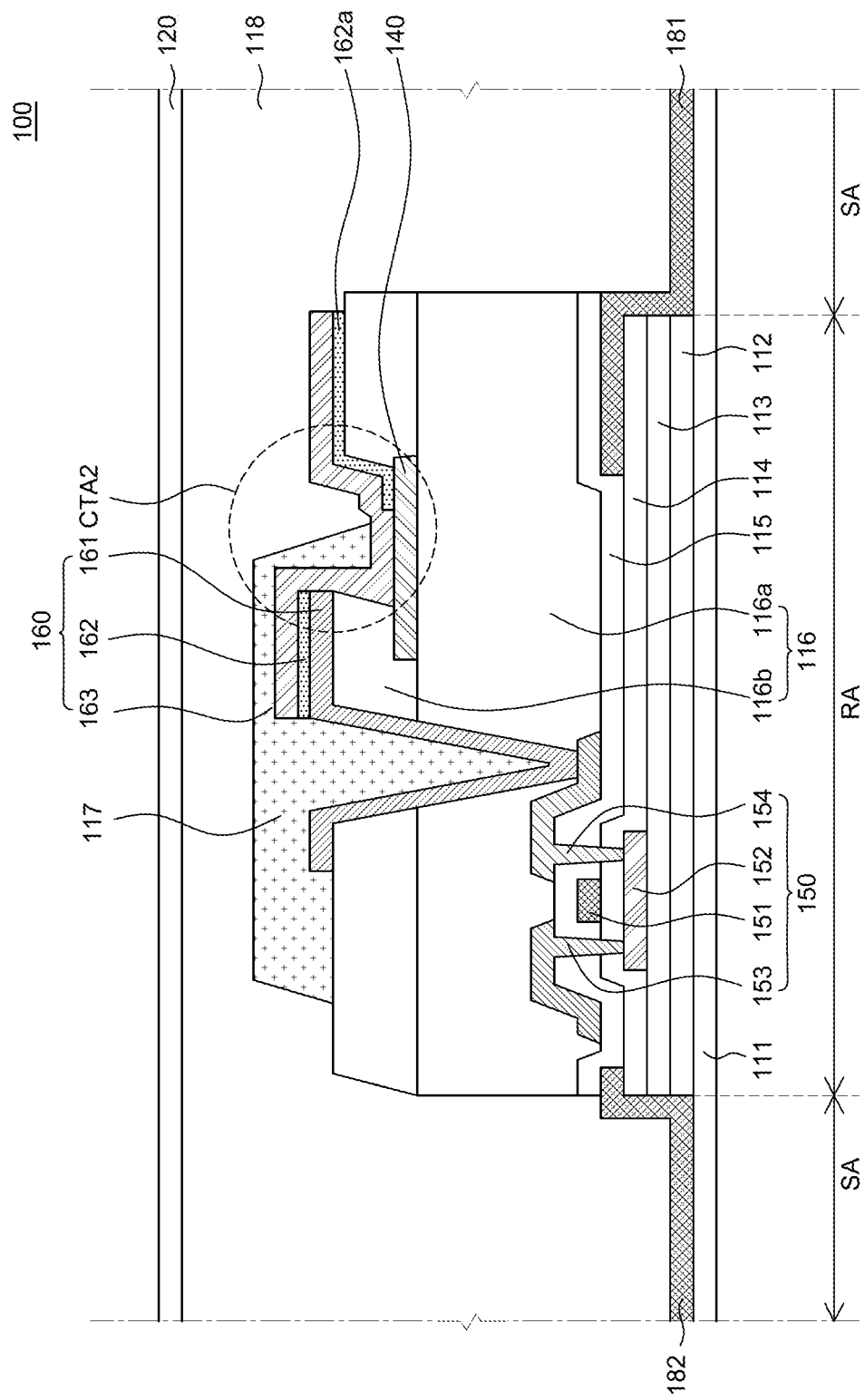
FIG. 7B is a schematic cross-sectional view taken along line VII-VII' of FIG. 4.

FIG. 6A is a cross-sectional view taken along line VI-VI' of FIG. 4. FIG. 6B is a schematic cross-sectional view taken along line VI-VI' of FIG. 4. FIG. 7A is a cross-sectional view taken along line VII-VII' of FIG. 4. FIG. 7B is a schematic cross-sectional view taken along line VII-VII' of FIG. 4.

Before describing FIGS. 6A to 7B, FIG. 6A is a cross-sectional view taken along line VI-VI' of FIG. 4, FIG. 6B is a cross-sectional view taken along line VI-VI' of FIG. 4 for showing a transistor together disposed on a subpixel, FIG. 7A is a cross-sectional view taken along line VII-VII' of FIG. 4, and FIG. 7B is a schematic cross-sectional view taken along line VII-VII' of FIG. 4 for showing a transistor together disposed on a subpixel. Referring to FIGS. 6A to 7B, a rigid area RA and a soft area SA may be defined on the lower substrate 110 of the stretchable display device 1000 according to an embodiment of the present disclosure. The rigid area RA may be an area where only the second substrates 112 are disposed on the first substrate 111 and the soft area SA may be an area where only the first substrates 111 are disposed. Meanwhile, although a plastic material having flexibility for making the second substrate 112 is shown as being disposed only in the rigid area RA, it is not limited thereto. For example, a plastic material having flexibility may be further disposed along the shape of the connecting line 180 even in the soft area SA to suppress damage to the connecting line 180.

In this regards, soft area SA is also referred as flexible area.

A buffer layer 113 is disposed on the second substrate 112. The buffer layer 113 is formed on the second substrate 112 to protect various components of the stretchable display device 1000 from water $H_2O$ and oxygen $O_2$ that may permeate from the outside of the first substrate 111 and the second substrate 112 of the lower substrate 110. The buffer layer 113 may be made of an insulating material, and for example, may be a single inorganic layer or a multi-inorganic layer made of graphite, silicon nitride (SiNx), silicon oxide (SiOx), or silicon oxynitride (SiON). However, the buffer layer 113 may be omitted, depending on the structure or characteristics of the stretchable display device 1000.

At this time, the buffer layer 113 may be formed only in an area overlapping the second substrate 112. As described above, since the buffer layers 113 may be made of an inorganic material, they may be easily damaged, such as cracking, when the stretchable display device 1000 is stretched. Accordingly, the buffer layer 113 is patterned in the shape of the plurality of second substrates 112 without being formed in the areas between the plurality of second substrates 112, whereby it may be formed only on the plurality of second substrates 112. Therefore, since the buffer layer 113 is formed only in the areas overlapping the plurality of second substrates 112 that is rigid substrates, it is possible to suppress damage to the buffer layer 113 even though the stretchable display device 1000 according to an embodiment of the present disclosure is deformed, such as, bending or stretching.

Referring to FIGS. 6B and 7B, a transistor 150 including a gate electrode 151, an active layer 152, a source electrode 153, and a drain electrode 154 is formed on the buffer layer 113. For example, the active layer 152 is formed on the buffer layer 113, and a gate insulating layer 114 for insulating the active layer 152 and the gate electrode 151 from each other is formed on the active layer 152. An inter-layer insulating layer 115 is formed to insulate the gate electrode 151, the source electrode 153, and the drain electrode 154 from each other, and the source electrode 153 and the drain electrode 154 that are in contact with the active layer 152, respectively, are formed on the inter-layer insulating layer 115.

Referring to FIGS. 6A to 7B, a low-potential power connecting line 182LV, a first connecting line 181, and a second connecting line 182 are disposed on the gate insulating layer 114. The low-potential power connecting line 182LV is a line for transmitting a low-potential power voltage to a plurality of subpixels SPX, the first connecting line 181 is a line for transmitting a gate signal to a plurality of subpixels SPX, and the second connecting line 182 is a line for transmitting a data signal to a plurality of subpixels SPX. The low-potential power connecting line 182LV, the first connecting line 181, and the second connecting line 182 may be formed in a type in which conductive particles are distributed in a base polymer, may be made of the same material as the gate electrode 151, or may be made of a metal material such as copper (Cu), gold (Au), or silver (Ag) that can form a line to have a curved shape, but they are not limited thereto.

Meanwhile, referring to FIGS. 6A and 6B, the low-potential power connecting line 182LV is in direct contact with the cathode 163 disposed at an upper portion in a first contact area CTA1. That is, the low-potential power connecting line 182LV may be electrically connected with the cathode 163. Accordingly, the cathode 163 can receive a lower-potential power voltage transmitted through the low-potential power connecting line 182LV without a pad. Accordingly, in the stretchable display device 1000 according to an embodiment of the present disclosure, there is no need for disposing specific configuration for electrically connecting the low-potential power connecting line 182LV and the cathode 163 disposed on the second substrate 112, for example, a pad. Therefore, the low-potential power connecting line 182LV and the cathode 163 can be more easily electrically connected.

The low-potential power connecting line 182LV may not be in direct contact with the cathode 163 in the soft area SA. Accordingly, the organic light emitting material 162a is not formed only in the light emitting area, but may be disposed in the area that is not the light emitting area in the process of manufacturing the organic light emitting layer 162, so the organic light emitting material 162a disposed in this way can electrically insulate the low-potential power connecting line 182LV and the cathode 163.

The low-potential power connecting line 182LV may be in electrical contact with the auxiliary line 140. In more detail, the low-potential power connecting line 182LV may be in direct contact with the auxiliary line 140 disposed at an upper portion through the contact hole formed in the first planarization layer 116a. Accordingly, the low-potential power connecting line 182LV can directly apply a low-potential power voltage to the auxiliary line 140. Referring to FIGS. 6A to 7B, the gate insulating layer 114 and the inter-layer insulating layer 115 may be formed only in the area overlapping a plurality of second substrates 112 by patterning. The gate insulating layer 114 and the inter-layer insulating layer 115 may also be made of an inorganic material, equally to the buffer layer 113, so they may be easily damaged such as cracking when the stretchable display device 1000 is stretched. Accordingly, the gate insulating layer 114 and the inter-layer insulating layer 115 are not formed in the areas between the plurality of second substrates 112, that is, in the soft area and may be formed only on the plurality of second substrates 112 by patterning in the shape of the plurality of second substrates 112.

Only a driving transistor of various transistors that may be included in the stretchable display device 1000 is shown in FIGS. 6B and 7B for the convenience of description, but a switching transistor, a capacitor, etc., may be included. Further, although the transistor 150 is described as having a coplanar structure in this specification, various transistors, for example, having a staggered structure also may be used.

Referring to FIGS. 6A to 7B, a first planarization layer 116a is formed on the transistor 150 and the inter-layer insulating layer 115. The first planarization layer 116a is disposed to planarize the top of the transistor 150. The first planarization layer 116a is made of an organic material, for example, one or more materials of polyacrylates resin, epoxy resin, phenolic resin, polyamides resin, polyimides resin, unsaturated polyesters resin, poly-phenylenethers resin, poly-phenylenesulfides resin, and benzocyclobutene, but is not limited thereto. The first planarization layer 116a may have a contact hole for electrically connecting the transistor 150 and the anode 161.

Referring to FIGS. 6A and 6B, the first planarization layer 116a may have a slope that makes the width of the bottom surface be smaller than the width of the top surface as the side surface for electrical connection of the low-potential power connecting line 182LV and the cathode 163 disposed at a lower portion goes downward. As such, since a slope is formed on the first planarization layer 116a, the area where the cathode 163 and the low-potential power connecting line 182LV are in direct contact may be referred to as a first contact area CTA1. In other words, the first planarization layer 116a may have a slope shape on a side surface in correspondence to the first contact area CTA1. Meanwhile, the first planarization layer 116a is showing as having the slope that makes the width of the bottom surface be smaller than the width of the top surface as only the side surface of the area where the low-potential power connecting line 182LV and the cathode 163 are in contact goes downward in FIGS. 6A and 6B. Stated differently, the first planarization layer 116a has a side surface that is sloped inwardly from a top surface to a bottom surface of the first planarization layer 116a, and the first planarization layer has a width at the bottom surface that is less than a width at the top surface, and a portion of the low-potential power connecting line 182LV is exposed by the sloped side surface of the first planarization layer 161a. However, the first planarization layer 116a is not limited thereto and may have a slope that makes the width of the bottom surface be smaller than the width of the top surface as another side surface of the first planarization layer 116a where the low-potential power connecting line 182LV and the cathode 163 are not in contact also goes downward. That is, the first planarization layer 116a disposed in the subpixel SPX may have a reverse-taper shape.

In some embodiments, a passivation layer may be formed between the transistor 150 and the first planarization layer 116a. That is, a passivation layer covering the transistor 150 may be formed to protect the transistor 150 from permeation of water, oxygen, etc. The passivation layer may be made of an inorganic material and may be composed of a single layer or a multi-layer, but is not limited thereto.

Referring to FIGS. 6A to 7B, an auxiliary line 140 is disposed on the first planarization layer 116a. The auxiliary line 140 is in direct contact with the cathode 163 in a second contact area CTA2. That is, the auxiliary line 140 is electrically connected with the cathode 163. Further, the auxiliary line 140, referring to FIGS. 6A and 6B, may be disposed by extending from the second contact area CTA2 through the first planarization layer 116a and the inter-layer insulating layer 115. Accordingly, the auxiliary line 140 may be in direct contact with the low-potential power connecting line 182LV through the contact hole formed in the first planarization layer 116a and the inter-layer insulating layer 115 in an area adjacent to the first contact area CTA1.

The auxiliary line 140 is disposed to partially overlap the second planarization layer 116b divided for each subpixel SPX. The second planarization layer 116b includes a plurality of separate divided portions, each of which corresponds to one of the subpixels SPX. The auxiliary line 140 has the shape of the second planarization layer 116b disposed at an upper portion, for example, a slope shape making the width be narrower downward, that is, the reverse-taper shape, as shown in FIG. 4, whereby a portion of the auxiliary line 140 may be exposed to the outside. The auxiliary line 140 may be in direct contact with the cathode 163 in the second contact area CTA2 by the shape of the second planarization layer 116b. The auxiliary line 140 may be made of the same material as the anode 161 of the organic light emitting element 160, but is not limited thereto. However, since the auxiliary line 140 may be disposed to overlap the light emitting area, it may be preferable that the auxiliary line 140 is made of a transparent conductive material.

Though not shown in FIGS. 6A to 7B, the connecting line 180 can transmit a gate signal or a data signal to the subpixel SPX by a pad that may be referred to as a gate pad or a data pad. As such, when the connecting line 180 is electrically connected with the subpixel SPX through a pad, the pad may be disposed on any one layer of the first planarization layer 116a and the inter-layer insulating layer 115.

Referring to FIGS. 6A to 7B, the second planarization layer 116b is disposed on the auxiliary line 140. The second planarization layer 116b is formed to insulate the auxiliary line 140 and the anode 161 from each other. The second planarization layer 116b may be made of the same material as the first planarization layer 116a. The second planarization layer 116b may further have a contact hole for electrical connection of the drain electrode 154 of the transistor 150 and the anode 161 of the organic light emitting element 160. At this time, the contact hole formed at the second planarization layer 116b may be disposed by extending the contact hole disposed in the first planarization layer 116a to electrically connect the drain electrode 154 of the transistor 150 and the anode 161 of the organic light emitting element 160.

The second planarization layer 116b may have a slope shape such that a portion of the auxiliary line 140 is exposed to the outside. That is, the second planarization layer 116b may have a reverse-taper shape in which the width of the bottom surface is narrower than the width of the top surface as it goes down for each subpixel SPX. Accordingly, the auxiliary line 140 can be exposed to the outside and the cathode 163 and the auxiliary line 140 disposed on the second planarization layer 116b can be more easily electrically connected.

The organic light emitting element 160 is disposed on the second planarization layer 116b. The organic light emitting elements 160 are components disposed to correspond to a plurality of subpixel SPX, respectively, and emit light having a specific wavelength band.

The organic light emitting element 160 includes an anode 161, an organic light emitting layer 162, and a cathode 163. In detail, the anode 161 is disposed on a second planarization layer 116b. The anode 161 is an electrode configured to supply holes to the organic light emitting layer 162. The anode 161 may be made of a transparent conductive material with a high work function. The transparent conductive material may include indium tin oxide (ITO), indium zinc oxide (IZO), and indium tin zinc oxide (ITZO). When the stretchable display device 1000 is implemented in a top emission type, the anode 161 may further include a reflective plate.

The anodes 161 are spaced apart respectively for subpixels SPX and electrically connected with the transistor 150 through contact holes of the first polarization layer 116a and the second planarization layer 116b. For example, although the anode 161 is shown as being electrically connected with the drain electrode 154 of the transistor 150 in FIGS. 6B to 7B, it may be electrically connected with the source electrode 153.

The organic light emitting layer 162 is disposed on the anode 161. The organic light emitting layer 162 is configured to emit light. The organic light emitting layer 162 may include a luminescent material, and the luminescent material may include a phosphorous material or a fluorescent material, but is not limited thereto.

The organic light emitting layer 162 may be composed of one light emitting layer. Alternatively, the organic light emitting layer 162 may have a stacked structure in which a plurality of light emitting layers is stacked with charge generation layers therebetween. The organic light emitting layer 162 may further include at least one organic layer of a hole transporting layer, an electron transporting layer, a hole blocking layer, an electrode blocking layer, a hole injection layer, and an electron injection layer.

Referring to FIGS. 5A to 7B, the cathode 163 is disposed on the organic light emitting layer 162. The cathode 163 supplies electrons to the organic light emitting layer 162. The cathode 163 may be made of indium tin oxide (ITO)-based, indium tin zinc oxide (ITZO)-based, zinc oxide (ZnO)-based, and tin oxide (TO)-based transparent conductive oxides or a Ytterbium (Yb) alloy. Alternatively, the cathode 163 may be made of a metal material.

The cathodes 163 may be formed by patterning to respectively overlap the plurality of second substrates 112. That is, the cathodes 163 may be disposed not in the areas between the plurality of second substrates 112, but only in the areas overlapping the plurality of second substrates 112. Since the cathodes 163 are made of a material, such as, transparent conductive oxide, a metal material, and the like, when the cathodes 163 are formed even in the areas between the plurality of second substrates 112, the cathodes 163 may be damaged when the stretchable display device 1000 is stretched. Accordingly, the cathodes 163 may be formed to respectively correspond to the plurality of second substrates 112 in a plane.

The cathode 163 may be formed along the shape of the first planarization layer 116a and the second planarization layer 116b from the light emitting area where the organic light emitting layer 162 is formed together with the anode 161. In more detail, the cathode 163, as shown in FIGS. 6A and 7A, is disposed along the upper portion of the second planarization layer 116b and any one side surface of the first planarization layer 116a along the shape of the first planarization layer 116a and the second planarization layer 116b that have a slope shape. Here, the any one side surface is a side surface where the first contact area CTA1 where the low-potential power connecting line 182LV and the cathode 163 are in direct contact is disposed. Accordingly, the cathode 163 may be in direct contact with the low-potential power connecting line 182LV exposed to the outside by the slope shape of the first planarization layer 116a and may be in direct contact with the auxiliary line 140 by the slope shape of the second planarization layer 116b.

As such, in the stretchable display device 1000 according to an embodiment of the present disclosure, by forming a slope on the first planarization layer 116a and the second planarization layer 116b to have a similar shape to a reverse-taper shape, it is possible to be in direct contact with the auxiliary line 140 and the low-potential power connecting line 182LV disposed at a lower portion even without a specific bank or partition wall. Accordingly, since there is no need for disposing specific configuration to bring the cathode 163 and the auxiliary line 140 or the low-potential power connecting line 182LV in contact with each other in the stretchable display device 1000 according to an embodiment of the present disclosure, it may be more advantageous in terms of the area utilization.

Referring to FIGS. 6A to 7B, an encapsulation layer 117 is disposed on the organic light emitting element 160. The encapsulation layer 117 can seal the organic light emitting element 160 by coming in contact with a portion of the top surface of the second planarization layer 116b while covering the organic light emitting element 160. Accordingly, the encapsulation layer 117 protects the organic light emitting element 160 from water, air, or physical shock that may be applied from the outside.

The encapsulation layer 117 may be formed only in the areas overlapping the plurality of second substrates 112. As described above, since the encapsulation layers 117 may include an inorganic layer, they may be easily damaged, such as cracking, when the stretchable display device 1000 is stretched. In particular, since the organic light emitting element 160 is vulnerable to water or oxygen, when the encapsulation layer 117 is damaged, reliability of the organic light emitting element 160 may be reduced. Therefore, since the encapsulation layers 117 are not formed in the areas between the plurality of second substrates 112, that is, the soft areas SA where only the first substrate 111 is disposed, damage to the encapsulation layers 117 can be minimized even though the stretchable display device 1000 according to an embodiment of the present disclosure is deformed, such as, bending or stretching.

Compared with common flexible organic light emitting display devices of the related art, there is a difference in that the stretchable display device 1000 according to an embodiment of the present disclosure has a structure in which the plurality of second substrates 112 that is relatively rigid is disposed and spaced apart from each other on the first substrate 111 that is relatively soft. The cathodes 163 and the encapsulation layers 117 of the stretchable display device 1000 are disposed by being patterned to correspond to the plurality of second substrates 112, respectively. That is, the stretchable display device 1000 according to an embodiment of the present disclosure may have a structure that enables the stretchable display device 1000 to be more easily deformed when a user stretches or bends the stretchable display device 1000 and may have a structure that can minimize damage to the components of the stretchable display device 1000 when the stretchable display device 1000 is deformed.

In the stretchable display device 1000 according to an embodiment of the present disclosure, the low-potential power connecting line 182LV and the cathode 163 are in direct contact with each other by the slope shape that makes the lower width of the first planarization layer 116a be narrower downward in correspondence to the area where the low-potential power connecting line 182LV is disposed. Accordingly, the stretchable display device 1000 according to an embodiment of the present disclosure can directly transmit a low-potential power voltage transmitted from the low-potential power connecting line 182LV to the cathode 163. Therefore, there is no need for configuring a specific connecting pad for connecting the cathode 163 disposed on the second substrate 112 and the low-potential power connecting line 182LV disposed on a portion of the second substrate 112 and the first substrate 111. Accordingly, the stretchable display device 1000 according to an embodiment of the present disclosure can secure the area that is lost by disposing a pad on the second substrate 112. Further, since there is no need for separately disposing a connecting pad in the stretchable display device 1000 according to an embodiment of the present disclosure, the process of the stretchable display device 1000 also can be simplified more.

Further, in the stretchable display device 1000 according to an embodiment of the present disclosure, by disposing the second planarization layer 116b to be divided for each subpixel SPX, it is possible to minimize damage to the organic light emitting element 160 when the stretchable display device 1000 is stretched.

Further, in the stretchable display device 1000 according to an embodiment of the present disclosure, by further disposing the auxiliary line 140 electrically connected with the cathode 163 on the first planarization layer 116a, the electrical resistance of the cathode 163 can be reduced and the cathode 163 can be independently driven for each subpixel SPX.

At least some of the embodiments provided by the present disclosure can also be described as follows:

A stretchable display device according to an embodiment of the present disclosure includes: a stretchable first substrate; a plurality of second substrates on the first substrate, the second substrates spaced apart from another and having a greater rigidity than the first substrate; a transistor on each of the plurality of second substrates; a planarization layer on the transistor; and a light emitting element on the planarization layer, in which the planarization layer may have a reverse-taper shape. Accordingly, since the planarization layer has a reverse-taper shape in the stretchable display device according to an embodiment of the present disclosure, it is possible to be in direct contact with lines at a lower portion without specific configuration.

The light emitting element may be an organic light emitting element including an anode, an organic light emitting layer, and a cathode.

The cathode may be disposed on an entire area of the second substrates along a shape of the planarization layer.

The planarization layer may include a first planarization layer over the transistor and a second planarization layer on the first planarization layer.

The stretchable display device may further comprise an auxiliary line on the first planarization layer, The auxiliary line may be electrically connected to the cathode.

The stretchable display device may further comprise a low-potential power connecting line under the first planarization layer.

The low-potential power connecting line may be electrically connected to the cathode.

The first planarization layer may have a side surface that is sloped inwardly from a top surface to a bottom surface of the first planarization layer, and the first planarization layer may have a width at the bottom surface that is less than a width at the top surface, and a portion of the low-potential power connecting line may be exposed by the sloped side surface of the first planarization layer.

The second planarization layer may have the reverse-taper shape, and side surfaces of the second planarization layer may be tapered inwardly from an upper surface of the second planarization layer to a lower surface of the second planarization layer.

The stretchable display device may further include a plurality of electrical connecting lines, with each of the electrical connecting lines extending between and electrically coupling adjacent ones of the plurality of second substrates.

Each of the plurality of connecting lines may include a base polymer on the first substrate and conductive particles dispersed within the base polymer.

A stretchable display device according to another embodiment of the present disclosure may include: a stretchable first substrate; a plurality of second substrates on the first substrate, the second substrates spaced apart from one another, each of the second substrates having a plurality of subpixels configured to emit light with different wavelengths; a first planarization layer on each of the plurality of second substrates; at least one auxiliary line on the first planarization layer; and a second planarization layer on the first planarization layer on which the at least one auxiliary line is disposed. The second planarization layer may be divided into a plurality of separate portions, with each of the separate portions of the planarization layer corresponding to a respective one of the subpixels. Accordingly, since the organic light emitting element is formed on the second planarization layer disposed and divided for each subpixel in the stretchable display device according to another embodiment of the present disclosure, it is possible to reduce or minimize a crack of the organic light emitting element that may be generated when the stretchable display device is stretched.

Each of the separate portions of the second planarization layer may have a shape in which a width of a bottom surface is narrower than a width of a top surface.

The at least one auxiliary line may include a plurality of auxiliary lines, and the plurality of auxiliary lines may respectively correspond to the plurality of subpixels.

Each of the separate portions of the second planarization layer may partially overlap at least one of the auxiliary lines.

An anode, an organic light emitting layer, and a cathode may be sequentially disposed on the second planarization layer.

The cathode may be disposed along shapes of the first planarization layer and the second planarization layer.

The auxiliary lines and the cathode may receive a same power voltage.

A connecting line configured to supply the power voltage to the cathode may be disposed between the first planarization layer and the first substrate.

The connecting line may be in direct contact with the cathode.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A stretchable display device, comprising:
a stretchable first substrate;
a plurality of second substrates on the first substrate, the second substrates spaced apart from one another and having a greater rigidity than the first substrate;
a transistor on each of the plurality of second substrates;
a planarization layer on the transistor;
a light emitting element on the planarization layer; and
a low-potential power connecting line under the planarization layer,
wherein the planarization layer has a reverse-taper shape,
wherein the light emitting element is an organic light emitting element including an anode, an organic light emitting layer, and a cathode,
wherein the planarization layer includes a first planarization layer over the transistor and a second planarization layer on the first planarization layer,
wherein the low-potential power connecting line is electrically connected to the cathode, and
wherein a side surface of the first planarization layer is sloped inwardly from a top surface to a bottom surface of the first planarization layer, the first planarization layer having a width at the bottom surface that is less than a width of the first planarization layer at the top surface, a portion of the low-potential power connecting line being exposed by the sloped side surface of the first planarization layer.

2. The stretchable display device of claim 1, wherein the cathode is disposed on an entire area of the second substrates along a shape of the planarization layer.

3. The stretchable display device of claim 1, further comprising an auxiliary line on the first planarization layer, wherein the auxiliary line is electrically connected to the cathode.

4. The stretchable display device of claim 1, wherein the second planarization layer has the reverse-taper shape, side surfaces of the second planarization layer being tapered inwardly from an upper surface of the second planarization layer to a lower surface of the second planarization layer.

5. The stretchable display device of claim 1, further comprising:
a plurality of electrical connecting lines, each of the electrical connecting lines extending between and electrically coupling adjacent ones of the plurality of second substrates.

6. The stretchable display device of claim 5, wherein each of the plurality of connecting lines includes a base polymer on the first substrate and conductive particles dispersed within the base polymer.

7. A stretchable display device, comprising:
a stretchable first substrate;
a plurality of second substrates on the first substrate, the second substrates spaced apart from one another, each of the second substrates having a plurality of subpixels configured to emit light with different wavelengths;
a first planarization layer on each of the plurality of second substrates;
at least one auxiliary line on the first planarization layer; and
a second planarization layer on the first planarization layer on which the at least one auxiliary line is disposed, the second planarization layer being divided into a plurality of separate portions, each of the separate portions of the second planarization layer corresponding to a respective one of the subpixels.

8. The stretchable display device of claim 7, wherein each of the separate portions of the second planarization layer has a shape in which a width of a bottom surface is narrower than a width of a top surface.

9. The stretchable display device of claim 8, wherein the at least one auxiliary line includes a plurality of auxiliary lines, the plurality of auxiliary lines respectively corresponding to the plurality of subpixels.

10. The stretchable display device of claim 9, wherein each of the separate portions of the second planarization layer partially overlaps at least one of the auxiliary lines.

11. The stretchable display device of claim 10, wherein an anode, an organic light emitting layer, and a cathode are sequentially disposed on the second planarization layer.

12. The stretchable display device of claim 11, wherein the cathode is disposed along shapes of the first planarization layer and the second planarization layer.

13. The stretchable display device of claim 12, wherein the auxiliary lines and the cathode receive a same power voltage.

14. The stretchable display device of claim 13, further comprising a connecting line configured to supply the power voltage to the cathode, the connecting line disposed between the first planarization layer and the first substrate.

15. The stretchable display device of claim 14, wherein the connecting line is in direct contact with the cathode.

* * * * *